United States Patent [19]
Yee

[11] Patent Number: 5,392,045
[45] Date of Patent: Feb. 21, 1995

[54] FOLDER CIRCUIT FOR ANALOG TO DIGITAL CONVERTER

[75] Inventor: Philip W. Yee, Los Altos, Calif.

[73] Assignee: National Semiconductor Corporation, Santa Clara, Calif.

[21] Appl. No.: 972,746

[22] Filed: Nov. 6, 1992

[51] Int. Cl.[6] .............................................. H03M 1/14
[52] U.S. Cl. ..................................... 341/156; 341/155; 341/141; 327/65; 327/334
[58] Field of Search ............... 341/156, 158, 159, 141, 341/155; 307/296.1, 360, 491, 494, 498, 264, 268; 330/295

[56] References Cited

U.S. PATENT DOCUMENTS

| | | | |
|---|---|---|---|
| 3,187,325 | 6/1965 | Waldhauer et al. | |
| 3,569,746 | 3/1971 | Lacour et al. | 307/565 |
| 4,297,679 | 10/1981 | Arbel et al. | 341/156 |
| 4,642,482 | 2/1987 | Kasperkovitz et al. | 307/494 |
| 4,897,656 | 1/1990 | van de Plassche et al. | 341/159 |
| 4,939,517 | 7/1990 | Baltus et al. | 341/156 |
| 5,126,742 | 6/1992 | Schmidt et al. | 341/156 |
| 5,138,318 | 8/1992 | Matsuzawa | 341/156 |

OTHER PUBLICATIONS

"A High-Speed 8 Bit A/D Converter Based on a Gray-Code Multiple Folding Circuit"; U. Fiedler et al.; IEEE Journal of Solid-State Circuits, vol. SC-14, No. 3, Jun. 1979; pp. 547-551.

"A Monolithic 8-Bit Video A/D Converter"; R. Van de Grift et al.; IEEE Journal of Solid-State Circuits, vol. SC-19, No. 3, Jun. 1984; pp. 374-378.

"An 8-bit Video ADC Incorporating Folding and Interpolation Techniques"; R. Van de Grift et al.; IEEE Journal of Solid-State Circuits, vol. SC-22, No. 6, Dec. 1987; pp. 944-953.

*Primary Examiner*—Howard L. Williams
*Attorney, Agent, or Firm*—Flehr, Hohbach, Test, Albritton and Herbert

[57] ABSTRACT

A folder circuit maps an analog input voltage to an analog output voltage in accordance with a folding function having at least one folding point. The folder circuit includes a power supply node and at least one input differential stage. Each input differential stage has a first input node to which is applied the input voltage, a second input node to which is applied a first reference voltage corresponding to that stage's folding point, and two differential output nodes. A resistive network is connected between the power supply node and the two differential output nodes, and a current source draws a predefined current from each input differential stage. An output network generates an analog output voltage as a function of the highest voltages on the differential output nodes of all the stages of the folder circuit. A current injection circuit provides a level-shifting current to each input differential stage through the two differential output nodes. A clamping circuit connected between the power supply node and each of the differential output nodes prevents saturation of the transistors in the input differential stages. A set of feedback paths in the resistive network interconnect each differential output node with neighboring ones of the differential output nodes to increase the gain of the folder circuit near each of the folding points.

13 Claims, 26 Drawing Sheets

FOLDER CIRCUIT FOR ANALOG TO DIGITAL CONVERTER

CROSS REFERENCE TO RELATED APPLICATIONS

The present application is related to U.S. patent application Ser. Nos. 07/972,763, 07/972,829, 07/972,759, 07/972,753, and 07/972,752, all filed on Nov. 6, 1992, in the name of Philip W. Yee and assigned to National Semiconductor Corporation.

The present invention relates generally to analog to digital voltage converter circuits, and particularly to very high speed analog to digital converters for use in medical imaging systems and other applications that require data conversion rates of 10 Megahertz or faster and data conversions with 10-bits or more resolution.

BACKGROUND OF THE INVENTION

The increased usage of analog to digital converters (ADC's) within a variety of applications has provided an impetus for the development of inexpensive ADC's capable of relatively high-performance. Conventional "single conversion cycle flash" ADC's (also called "full-flash" ADC's) have generally been found to offer insufficient performance, and are often too costly for use in inexpensive consumer products. In particular, conventional flash converters include an array of $2^N-1$ comparators for comparing an analog input signal to a number of threshold reference voltages, where N is the number of output bits in the digital value generated by the ADC. The comparators are assumed to provide a logical ONE when the output of a comparator exceeds its threshold, and a logical ZERO otherwise. An array of latches determines the logical state of the comparators during each clock cycle and holds this information until sampling during the succeeding cycle. The outputs of each latch are then encoded into an output code. Among the disadvantages of the full-flash implementation are high power consumption, large chip area, as well as the requirements for numerous components and interconnection lines.

Two-conversion cycle flash ADCs and multiple-conversion cycle flash ADCs reduce the number of comparators needed by generating a subset of the output bits during each conversion cycle, but sacrifice speed. Such devices, with a typical conversion rate of one input sample per microsecond, are much too slow for medical imaging systems and other applications that require data conversion rates of 10 Megahertz or faster.

One method of decreasing the number of components required within an ADC, without requiring multiple conversion cycles, is effected through a technique commonly known as "folding". This technique reduces the size of the flash array necessary to implement a converter of a given precision by using the flash array (i.e., comparison circuits) in a more efficient manner. Specifically, in ADC's based on a folding architecture an analog processing circuit, a first flash array and decoder generate the most significant bits (MSBs) of the output value, while a "folder circuit" precedes a second flash array. The folder circuit effectively "subtracts" from the input signal the amount of voltage represented by the MSBs, leaving a remainder voltage that precisely corresponds to the least significant bits (LSBs) of the output value.

1 LSB is defined as the voltage step associated with the least significant bit of the ADC conversion value. In a 10-bit ADC, having an input voltage range of 2 volts, 1 LSB is 1.953125 millivolts.

Referring to FIG. 1A, there is shown a block diagram of a conventional 10-Bit folding analog to digital converter 100 incorporating a 5-Bit folder circuit 102. During each sampling period an analog input signal is sampled by an input sample and hold circuit 105 and applied to the 5-bit folder circuit 102 and to a conventional 5-bit MSB flash array 106.

FIG. 1B shows the ideal transfer function of the 5-bit folder circuit 102. The magnitude of the analog output of the folder circuit 102 is indicative of the value of the five least significant bits of the Sampled analog input. That is, the folder circuit output corresponds to a residual portion of the sampled analog input in excess of the voltage magnitude equivalent to the first five MSB's of the sampled analog input.

A digital code corresponding to the five MSB's of the analog input is produced by the 5-bit MSB flash array 106 in conjunction with an MSB decoder 108 that generates the actual five MSB's. The MSB flash array 106 compares the sampled input voltage with a first set of thirty-one reference voltages (which are spaced at 32 LSB intervals) from a voltage reference ladder 104, producing a 32-level "thermometer" code. The MSB decoder 108 converts that 32-level "thermometer" code into a 5-bit value.

Similarly, a second 32-level "thermometer" code is generated by a 5-bit LSB flash circuit 110, by comparing the output of the folder circuit 102 with a second set of thirty-one reference voltages (which are spaced at I LSB intervals) from a voltage reference ladder 104. The second thermometer code is transformed into a binary code by an LSB decoder 112 to yield the five LSBs of the analog input.

It should be noted that the reference voltages used in typical MSB and LSB flash arrays are offset by −0.5 LSB from their nominal values. The reason for the half LSB offset is that the standard specification for ADC circuits is that the digital output value should shift from one value to the next when the input voltage passes the halfway point between the two. For instance, the digital output value of the ADC switches from 0 to 1 when the input voltage Vin rises above 0.5 LSB.

As can be seen from the voltage transfer function shown in FIG. 1B, when the output voltage of the folder circuit 102 is on a positively sloped portion of its transfer function, the LSB decoder must generate a digital value that increases as the folder circuit output voltage increases. However, when the output voltage of the folder circuit is on a negatively sloped portion of its transfer function, the LSB decoder must generate a digital value that increases as the folder circuit output voltage decreases. Thus, the five LSBs to be generated by the ADC may be uniquely determined by the LSB decoder 112 only after it is known whether the output of the folder circuit 102 was based upon one of the positively-sloped or upon one of the negatively-sloped portions of the folder transfer characteristic. This information is inherent within the value of the lowest MSB, and is provided to the LSB decoder 112 by the MSB decoder 108. The requirement that the LSB decoder 112 be provided with information from the MSB decoder 108 tends to reduce the efficiency of the ADC 100, since the LSB decoder 112 is idle pending completion of the MSB flash operation.

It is noted that in MOS implementations of sample and hold circuits the analog input is applied to the source terminal of an input sampling transistor, and is allowed to pass therethrough during each clock cycle. The magnitude of the sampled analog signal is stored by a capacitor connected to the output (drain) terminal of the sampling transistor. This type of sample and hold circuit may be modeled as an RC circuit, where R is primarily determined by the channel resistance of the input transistor and where C corresponds to the capacitance value of the "holding" capacitor. Since the bias applied to the gate of the sampling transistor is a constant and the value of R depends on the gate to source voltage of the sampling transistor, the value of R varies as a function of the magnitude of the input voltage. Hence, harmonic distortion is introduced into the sampled input signal as a consequence of variation in the RC time constant of the sample and hold circuit.

The performance of the analog to digital converter 100 depends largely upon:

(1) the degree to which the folding function depicted in FIG. 1B may be accurately implemented by the folder circuit 102,
(2) accurate or consistent sampling of the input signal,
(3) the precision of the reference voltages provided by the reference ladder 104, and
(4) the speed of the folder circuit 102.

Each of these factors, other than the consistent sampling factor which was discussed above, are discussed next with reference to the diagram of a conventional folding circuit 102 shown in FIG. 2. Note that it is assumed in this circuit that the analog input voltage range is −2 volts to 0 volts.

Conventional folding circuits have been shown to introduce distortion into the ideal transfer characteristic of FIG. 1B. Referring to FIG. 2, the accuracy of the gain of the folder circuit 102 is dependent upon the ratio of the pull-up resistors R1, R2 and R3 (which ideally should all be precisely equal) to the current drawn by current sources I. However, the gain may be affected by contributions from the base currents of transistors T1–T4. Thus, non-uniformities in the current sources and pull-up resistors and base currents in the folder circuit's transistors all contribute to deviation in the gain of the folder circuit 102 from a specified ideal absolute value.

As is indicated by FIG. 1B, the folding circuit 102 is characterized by a piece-wise linear transfer characteristic. Such linearity has proven difficult to achieve in practice, however, due to the hyperbolic tangent transfer characteristic of the differential transistor pairs T1–T2, T3–T4, only two of which are shown in FIG. 2. Efforts directed to improving the linearity of these differential pairs have involved connecting resistors to the emitter of the transistors within each differential pair. While this has led to improved linearity, it has also tended to reduce circuit gain and requires the matching of an additional pair of resistors.

Referring to FIG. 1B and to FIG. 2, when the sampled analog input is near the $m^{th}$ multiple of the reference voltage $V_R$ the current from current source 11 is split primarily between transistors TRm and TR(m+1). This results in a reduction of the base-emitter voltage drop through these transistors relative to the case in which current flow is predominantly through only one of the transistors TR. It follows that the actual output voltage of the folder circuit 102 tends to be higher than desired in response to analog inputs which are proximate multiples of the reference voltage $V_R$. The non-linearity introduced into the transfer characteristic of the folder 102 as a consequence of this effect is depicted in FIG. 3, in which the folder output voltage at room temperature is shown to be offset by approximately 18 mV from the desired output voltage for analog inputs near multiples of the reference voltage $V_R$.

As may also be appreciated with reference to FIG. 3, the voltage at node N2 of the folder circuit 102 (FIG. 2) varies between VN2,max and VN2,min as a function of the sampled analog input. Referring to FIG. 2, the peak output voltage of the folder circuit 102 is one base-emitter threshold (VBE) below the maximum voltages impressed upon the nodes N1, N2, . . . Nn. The maximum voltage at the nodes N1, N2, . . . , Nn occurs for analog inputs having magnitudes midway between adjacent reference voltages and cannot exceed −Vupper, where Vupper is the voltage drop across resistors R1, R2, . . . Rn, when the current drawn through each such resistor is at its minimum level.

With reference to FIG. 2, the speed of the conventional folder 102 can be degraded by saturation effects precipitated by relatively large analog input voltages. In particular, when the analog signal applied to the input transistor of a differential pair becomes large compared with the associated reference voltage the input transistor tends to be driven into saturation, i.e., the collector voltage exceeds the saturation threshold. Saturation of the input transistors within a differential pair reduces the rate at which the associated folder stage is capable of responding to changes in the sampled analog input.

Efforts have also been made to enhance the precision of the reference voltages supplied to the flash arrays and folder circuits included within high-speed ADC's. For example, ADC's designed to be incorporated within high-speed video processing systems often include low-impedance voltage reference ladders for providing a set of reference voltages. Referring to the conventional reference ladder shown in FIG. 4, a resistive diffusion or metallic interconnection line $R_D$ is operatively connected to positive (+V1) and negative (−V2) force voltages supplied by a force and sense circuit. The force and sense circuit is employed to set the voltage at sense terminals S1 and S2 at either end of the resistive line $R_D$ to the reference potentials MinV$_R$ and MaxV$_R$. Specifically, the force and sense circuit includes a feedback network which adjusts the magnitude of +V1 and −V2 so that MinV$_R$ and MaxV$_R$ are applied to the resistive line $R_D$ despite the presence of parasitic interconnection resistance Rp. In this way the magnitude of the reference potentials are made to be relatively independent of the magnitude of Rp. Since the resistive line RD is assumed to be of uniform width, the tap points corresponding to each reference potential may be determined through linear interpolation.

In many analog to digital converters the reference potentials MinV$_R$ and MaxV$_R$ correspond to the zero and full-scale values used during the conversion process. Nonetheless, certain high-speed ADC's include folding circuits which require internal voltage references which are several LSBs beyond these zero and full-scale values. Simply increasing the dynamic range between the zero and full-scale values to include these additional reference voltages has been considered, but would lead to unusual values for the zero and full-scale references. This would, in turn, complicate the interpolation process used to select the tap points corresponding to the remaining reference values.

Referring to FIG. 5, the actual relationship between the locations of tap points along the resistive line RD and the corresponding reference voltages (solid line) is seen to be nonlinear when current is drawn from the tap points, such as to provide the base current of NPNs in the ADC's folder circuits and in the ADC's flash arrays. The resulting error between the ideal linear interpolation characteristic (dashed line) and that actually obtained can lead to significant error in the reference voltages derived from tap points proximate the center of the resistive line RD.

Because operation of the folder circuit 102 is predicated upon the absolute gain and linearity of its constituent circuit elements, its output is relatively sensitive to variation in temperature. Accordingly, it has generally been necessary to develop performance specifications based on limited temperature ranges.

SUMMARY OF THE INVENTION

In summary, the present invention is a folder circuit for mapping an analog input voltage to an analog output voltage in accordance with a folding function having at least one folding point. The conventional portions of the folder circuit include a power supply node and at least one input differential stage. Each input differential stage has a first input node to which is applied the input voltage, a second input node to which is applied a first reference voltage corresponding to that stage's folding point, and two differential output nodes. A resistive network is connected between the power supply node and the two differential output nodes, and a current source draws a predefined current from each input differential stage. Finally, an output network generates an analog output voltage as a function of the highest voltages on the differential output nodes of all the stages of the folder circuit.

A first improvement on the conventional folder circuit is a current injection circuit for providing a level-shifting current to each input differential stage through the two differential output nodes. This level shifts the generated output voltages, allowing the dynamic range of the generated output voltage to be increased.

A second improvement on the conventional folder circuit is a clamping circuit that includes a diode connected between the power supply node and each of the differential output nodes. The clamping circuit prevents saturation of the transistors in the input differential stages.

A third improvement on the conventional folder circuit is a set of feedback paths in the resistive network so as to interconnect each differential output node with neighboring ones of the differential output nodes. The feedback paths change increase the gain of the folder circuit near each of the folding points.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1A:
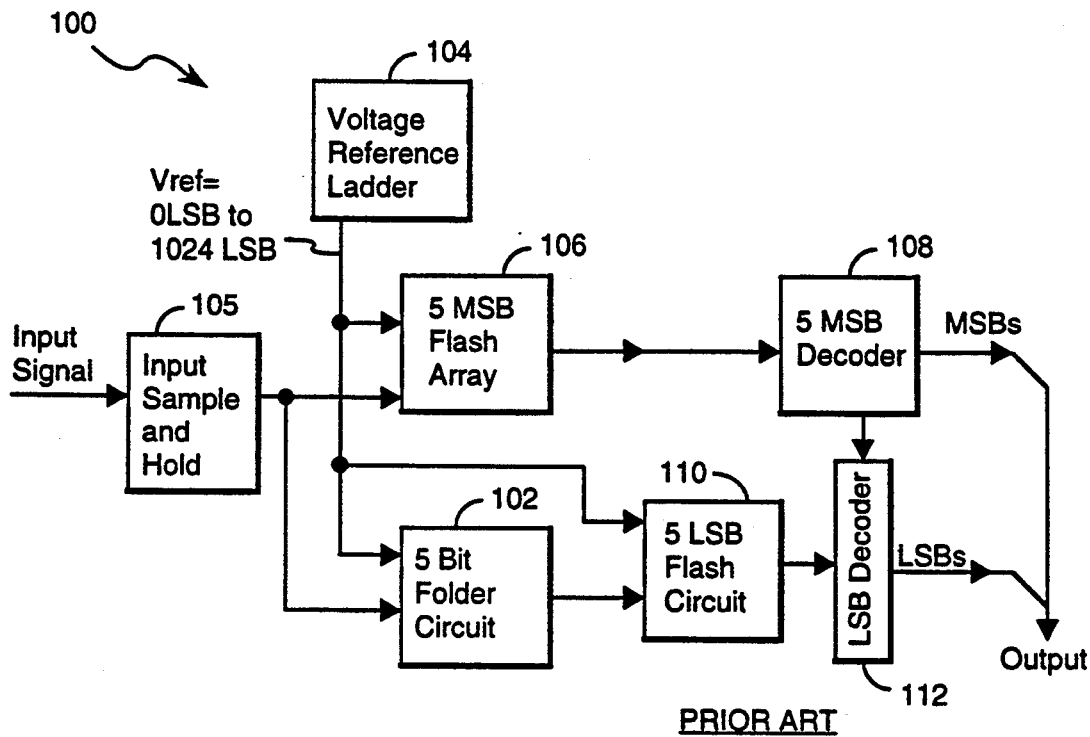
FIG. 1A is a block diagram of conventional analog to digital converter using a folder circuit to reduce the size of the flash arrays needed.

Again referring to FIG. 1A, the conventional ADC 100 is of the type that uses folder circuits to reduce the size of the flash arrays needed. A specific implementation of the ADC 100 is described as follows in order to facilitate appreciation of the features offered by the improved folder circuit of the present invention. Specifically, it will be assumed that the ADC 100 is a 10-bit converter, although this basic circuit organization could be used for other converters, such as an 8-bit ADC. In a 10-bit converter, the input voltage range can be measured in units of "LSBs", where 1 LSB is the voltage difference associated with a change of 1 in the digital output value. Thus the input voltage range is 1024 LSBs for a 10-bit ADC, or 256 LSBs for an 8-bit ADC. The analog to digital conversion process is initiated when an input signals is received by a sample and hold circuit 102. To generate the five most significant bits, thirty-one comparators are used to compare the input voltage with thirty-one reference voltages, VR, ranging from 32 LSB to 992 LSB, in steps of 32 LSB.

IMPROVED FOLDER CIRCUIT

Figure 6:
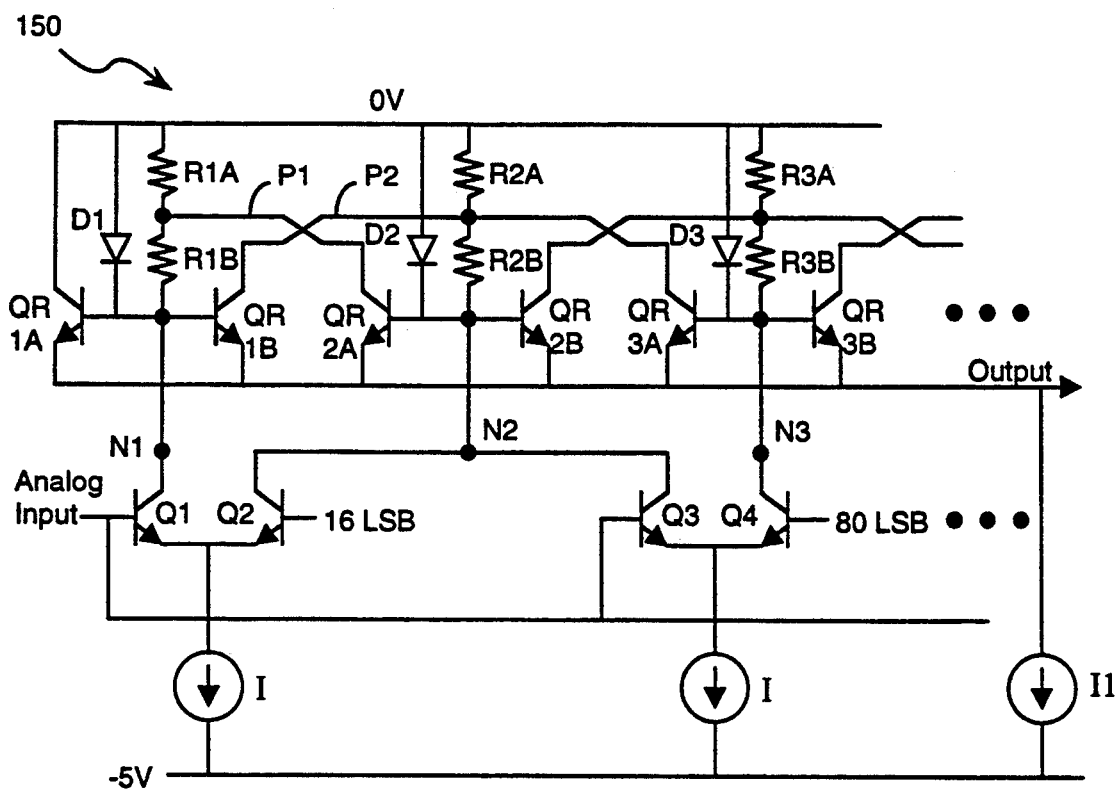
FIG. 6 is a circuit diagram of a preferred folder circuit in accordance with the present invention.

FIG. 6 is a circuit diagram of a preferred folder circuit 150 in accordance with the present invention. In the specific implementation of the FIG. 6 the folder 150 is a 4-bit folder circuit designed to be incorporated within a somewhat different 10-bit ADC than the one shown in FIG. 1A. The folder circuit 150 provides a transfer function having folding points at reference voltages having magnitudes equivalent to 16 LSB, 80 LSB, . . . 976 LSB (not shown). As shown in FIG. 6, an analog input is applied to a first transistor Q1 of a first input differential stage. The first input differential stage further includes a second transistor Q2 to which is applied a first reference voltage of a magnitude equivalent to 16 LSB. This magnitude corresponds to the first folding point of the folding transfer function characterizing the folder circuit 150. In like manner the analog input and a second reference voltage (80 LSB) are applied to third and fourth transistors Q3 and Q4 of a second input differential stage. A plurality of current sources I connected to a negative power supply rail (−5V) draw identical quiescent currents through each input differential stage. In addition, a current source l1 fixes the current through transistors QR1A, QR1B, QR2A, . . .

As shown in FIG. 6, a first resistive network including resistors R1A and R1B is connected to a first differential output node N1 of the first differential stage. Similarly, a second resistive network including transistors R2A and R2B is connected a second differential output node N2 of the first differential stage, wherein the node N2 also constitutes a first output node of the second differential stage. The magnitude of the current sources coupled to each differential stage are selected in conjunction with the equivalent resistance ($R_{EQ}$) of each resistive network in accordance with the desired minimum output voltage of the folder 150. That is, the output voltage provided by the folder is at a minimum, i.e., at approximately $-IR_{EQ}/2$, when the analog input is equal to one of the reference voltages. For example, for an analog input equivalent to 16 LSB's an equal current of I/2 is conducted by the transistors Q1 and Q2. Since this input is not large enough to turn on transistor Q3, a current I will be conducted by transistor Q4. It follows that equal currents of I/2 will flow through the first and second resistive networks into the transistors Q1 and Q2, and hence that the output voltage of the folder 150 will be approximately one bipolar transistor turn-on voltage below $-IR_{EQ}/2$.

As will now be described with reference to FIGS. 6 and 7, a current injection circuit 270 is operative to increase the maximum folder output voltage. Note that the folder output is at its maximum when the analog input voltage is equally offset from successive reference voltages. For example, for an analog input voltage of 48 LSB (i..e., half-way between the 16 LSB and 80 LSB reference voltages) the current through the first and second input differential stages will be predominantly through transistors Q1 and Q4. Under this condition the current through the second resistive network into node N2 is at a minimum (lmin), which causes the folder output voltage to rise to approximately one bipolar turn-on voltage less than $lmin \times R_{EQ}$. Accordingly, elimination of the current lmin would allow the maximum value of the folder output voltage to rise to the value of the upper power supply (0V) minus one bipolar turn-on voltage.

Figure 7:
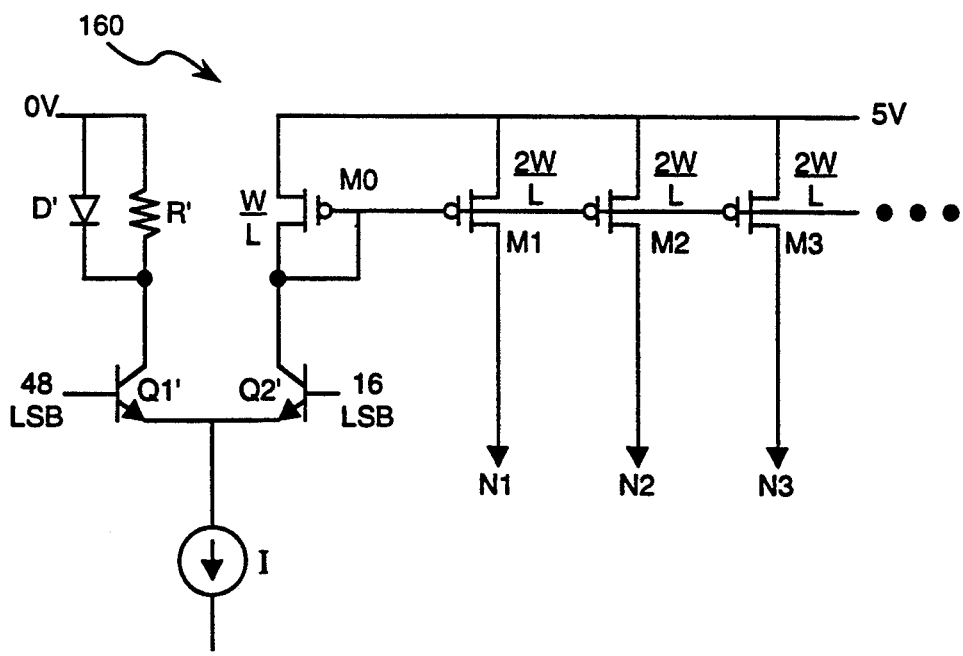
FIG. 7 is a circuit diagram of a current injection circuit for use in conjunction with the folder circuit of FIG. 6.

Referring to FIG. 7, the current injection circuit 160 is operative to continuously inject a current of magnitude lmin into each of the nodes N1, N2, N3, . . . NM, where M = 16. Again considering the case of an applied analog input voltage midway between the first and second reference voltages, i.e., 48 LSB, the inputs to the first differential stage (48 LSB and 16 LSB) are separated by 32 LSB. Similarly, the inputs to the second differential stage (48 LSB and 80 LSB) are separated by 32 LSB. Equal currents of lmin/2 will thus be conducted by transistors Q2 and Q3 such that lmin is pulled through the second resistive network.

Referring to FIG. 7, the current injection circuit 160 includes a differential pair having transistors Q1' and Q2' substantially identical to the transistors Q1 and Q2. The collector of transistor Q1' may be directly connected to a power supply of 0V or, alteratively, may be coupled thereto via the parallel connection of diode D' and resistor R' as shown in FIG. 7. Within the current injection circuit 160 a current substantially identical to lmin/2 is induced to flow within transistor Q2' by driving the differential pair of Q1' and Q2' with voltages separated by 32 LSB (16 LSB and 48 LSB). A current mirror comprised of an MOS transistor M0 having channel width to length ratio of W/L, and MOS transistors M1 – Mn characterized by channel ratios of 2W/L serve to supply the nodes N1 – Nn with a current equivalent to twice that conducted by transistor Q2', i.e., with the current lmin. This enables the output voltage of folder circuit 150 to rise to within approximately one transistor turn-on voltage below the upper power supply rail (0V). In contrast to conventional folder circuits, the folder of the present invention is thus capable of providing an output voltage not constrained to remain below the upper power supply by the amount Vupper + $V_{BE}$ (see the Background of the Invention).

As was also discussed in the Background of the Invention, the transfer characteristic of conventional folder circuits tends to become nonlinear for analog input voltages near each of the folding points. The folder 150 is designed to substantially eliminate this non-linearity by a cross-coupling arrangement which includes a first feedback path between the second resistive network and transistor QR1B, and a second feedback path between the first resistive network and transistor QR2A. Referring to FIG. 6, this cross-coupling is replicated in each succeeding stage of the folder 150. In the specific case where the analog input is of a magnitude approximately equal to the reference voltage corresponding to the first folding point (e.g., 16 LSB), substantially equal currents are drawn by the first and second resistive networks. It follows that the I1 current is divided between transistors QR1B and QR2A, resulting in a $V_{BE}$ that is less than the $V_{BE}$ generated when only one of the transistors QR1B and QR2A is sufficiently turned on to conduct appreciable current. This reduced base-emitter voltage drop through the transistors QR1B and QR2A would induce an undesired rise in the folder output voltage were it not for the provision of feedback paths P1 and P2.

Specifically, the resistor in each stage of the folder circuit is split in two portions A and B, and the voltage at node between the two resulting resistors is feed back to the collectors of the NPN transistors in the neighboring folder stages in directions. Thus, the feedback voltage from stage N of a folder circuit is feed back to the collectors of the NPN transistors in the both stages N−1 and N+1. The reason that feedback paths in both directions are necessary is that each folder node Ni below each resistor participates in the generation of two low points in the folder's output voltage, and thus it cannot be determined in advance which neighboring stage the feedback will be needed for an unknown input voltage.

As shown in FIG. 6, the collector terminals of transistors QR1B and QR2A are connected below resistors R2A and R1A rather than to the upper supply rail causes the folder output voltage to be negatively level-shifted in proportion to the voltage drop across resistors R2A and R1A. In the implementation of FIG. 6 the resistors R2A and R1A are selected to introduce a negative level-shift of approximately 18 mV into the folder output voltage for analog input voltages corresponding to the folder reference voltages.

As mentioned above, the speed of conventional folder circuits tends to be compromised due to saturation of the input differential pairs during application of large analog input voltages. This saturation occurs when the analog input applied to the base terminal of one of the transistors within the differential pair induces a collector current sufficiently high to drive the transistor into saturation. Referring to FIG. 6, the folder circuit 150 includes diode clamps D1, D2, ..., DM, connected between the upper power supply rail (0V) and the nodes N1, N2, ..., NM. The clamps D1, D2, ... DM prevent the collector voltages of the input transistors within each differential pair (e.g., Q1, Q3) from reaching saturation levels by limiting the current through each resistive network. For example, the diode D1 limits the collector voltage of transistor Q1 to approximately −0.7 V. In this way the speed of the folder 150 is enhanced relative to that of conventional folder circuits.

IMPROVED SAMPLE AND HOLD RECEIVER

Figure 8:
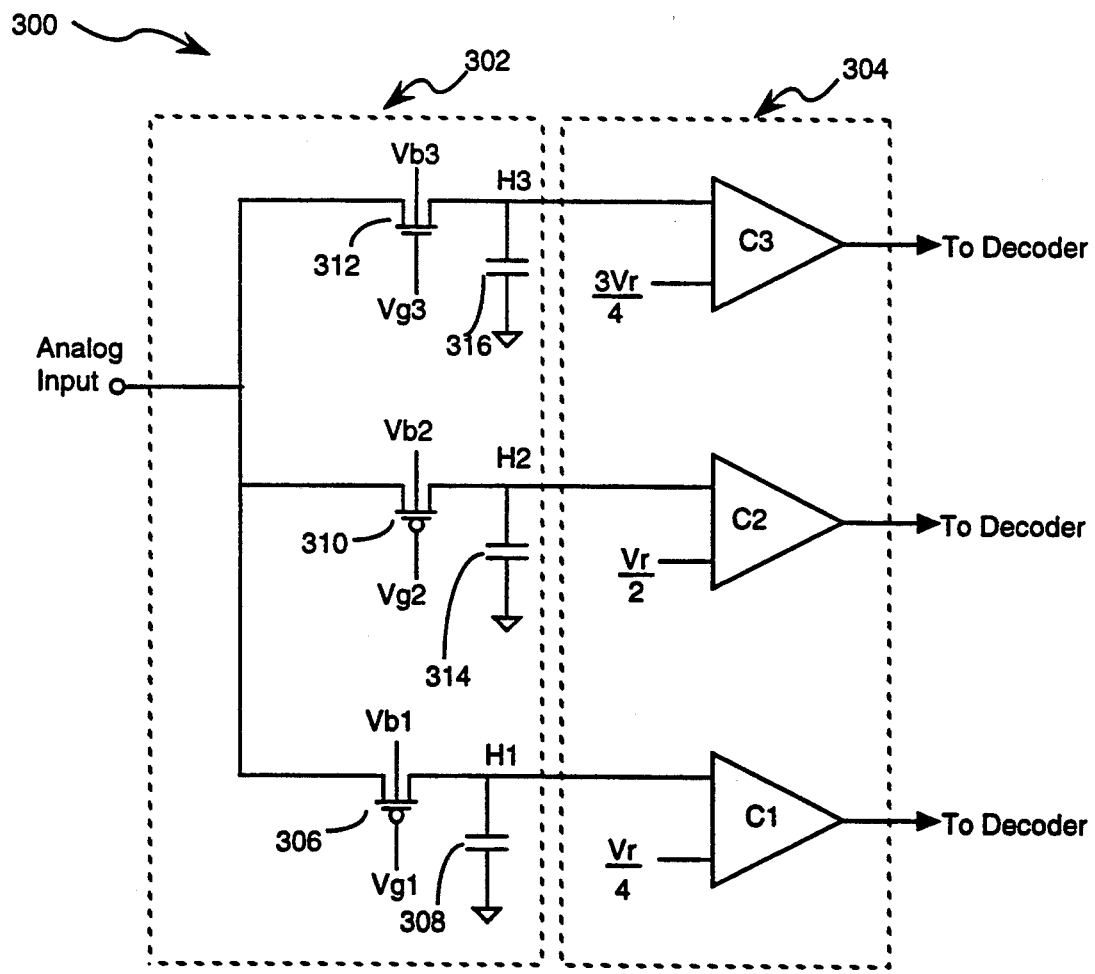
FIG. 8 is a circuit diagram of a simplified 2-bit implementation of a sample and hold voltage receiver in accordance with the present invention.

FIG. 8 is a circuit diagram of a simplified implementation of a 2-bit sample and hold voltage receiver 300 in accordance with the present invention. As shown in FIG. 8, the voltage receiver 300 includes a set 302 of sample and hold circuits operatively coupled to a set 304 of comparators in a flash analog to digital converter. The comparators 304 are operatively coupled to a decoder (not shown) of the flash converter.

Referring to the sample and hold circuits 302, a first such circuit includes an MOS sampling transistor 306 having a drain terminal connected to a first holding node H1. A first holding capacitor 308 is also connected to holding node H1, as is a first input terminal of a first comparator C1. The set point of the comparator C1 is held at a voltage Vr/4, where Vr corresponds to a full-scale reference voltage associated with the flash array. Second and third sampling transistors 310 and 312 are similarly connected to second and third holding nodes H2 and H3, as are second and third holding capacitors 314 and 316. The second and third holding nodes define the voltages at the inputs of second and third comparators C2 and C3, which are respectively referenced to the voltages Vr/2 and 3Vr/4.

As was previously discussed, in conventional sample and hold circuits used in conjunction with flash A/D's identical bias voltages are applied to each sampling transistor. As a consequence, the channel resistance of the sampling transistor varies as a function of the applied input voltage. This results in the creation of a nonlinear relationship between the analog input and the output of the comparator array included within the flash A/D. More precisely, the actual analog voltage at which a particular comparator is tripped will depend not only upon the magnitude of the comparator reference voltage, but also upon the channel resistance of the sampling transistor for voltages near the trip point of the associated comparator. Harmonic distortion results since there exists a unique trip point for each comparator, and consequently the channel resistance of the sampling transistors will be different in the vicinity of each trip point.

The present invention overcomes this difficulty by biasing the sampling transistors such that each exhibits substantially identical channel resistance for analog input voltages proximate the trip point of the associated comparator. For example, the gate and bulk bias voltages Vg2 and Vb2 applied to the second sampling transistor 310 are selected to be Vr/4 larger than the bias voltages Vg1 and Vb1 applied to the first sampling transistor 306. In this way the channel resistance of the first sampling transistor 306 when the analog input is near Vr/4 will be the same as that of the second sampling transistor 310 when the analog input is near Vr/2. Since, for the purpose of reducing or eliminating harmonic distortion, the channel resistance of a sampling transistor is only of concern for analog voltages proximate the trip point of the comparator to which it is coupled, it is clear that the present invention provides a technique for virtually eliminating harmonic distortion.

In the general case the gate and bulk bias voltages Vgi and Vbi will respectively be set as follows:

$$Vg(i) = Vg(i-1) + Vr/4$$

$$Vb(i) + Vb(i-1) + Vr/4$$

where i=2, 3. The gate and bulk bias voltages for the second and third sampling transistors 310 and 312 are thus seen to be offset in multiples of Vr/4 from the bias voltages Vg1 and Vb1 selected for the first sampling transistor 306.

Figure 9C:
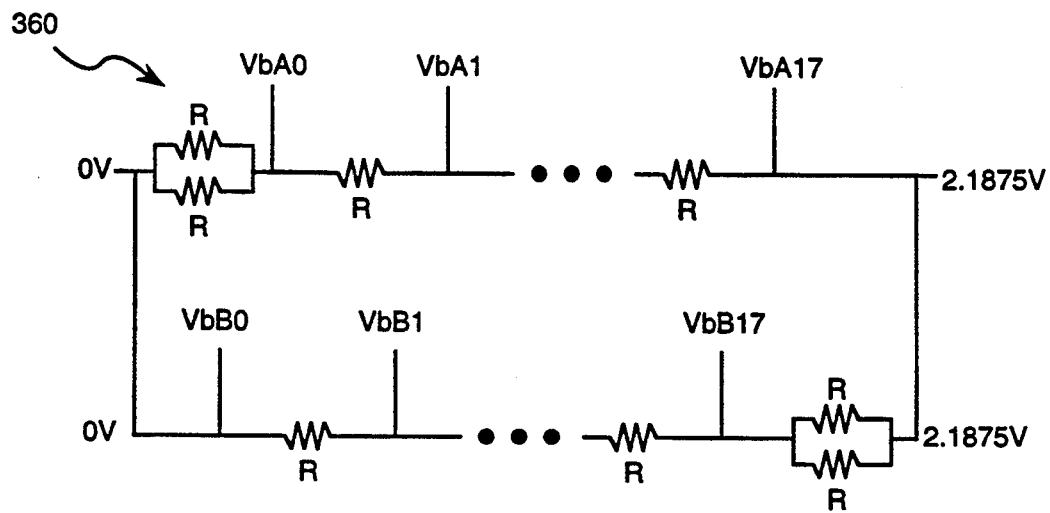
FIGS. 9A, 9B and 9C depict diagrams of circuits included within a preferred embodiment of the inventive analog sample and hold voltage receiver.

As is discussed below, the above-described technique for reducing harmonic distortion may be incorporated in other types of analog to digital converters (AD's) including, for example, ND's which utilize folder circuits. Specifically, FIGS. 9A, 9B and 9C are circuit diagrams which depict the manner in which the present invention may be implemented within a folding ND.

Figure 9A:
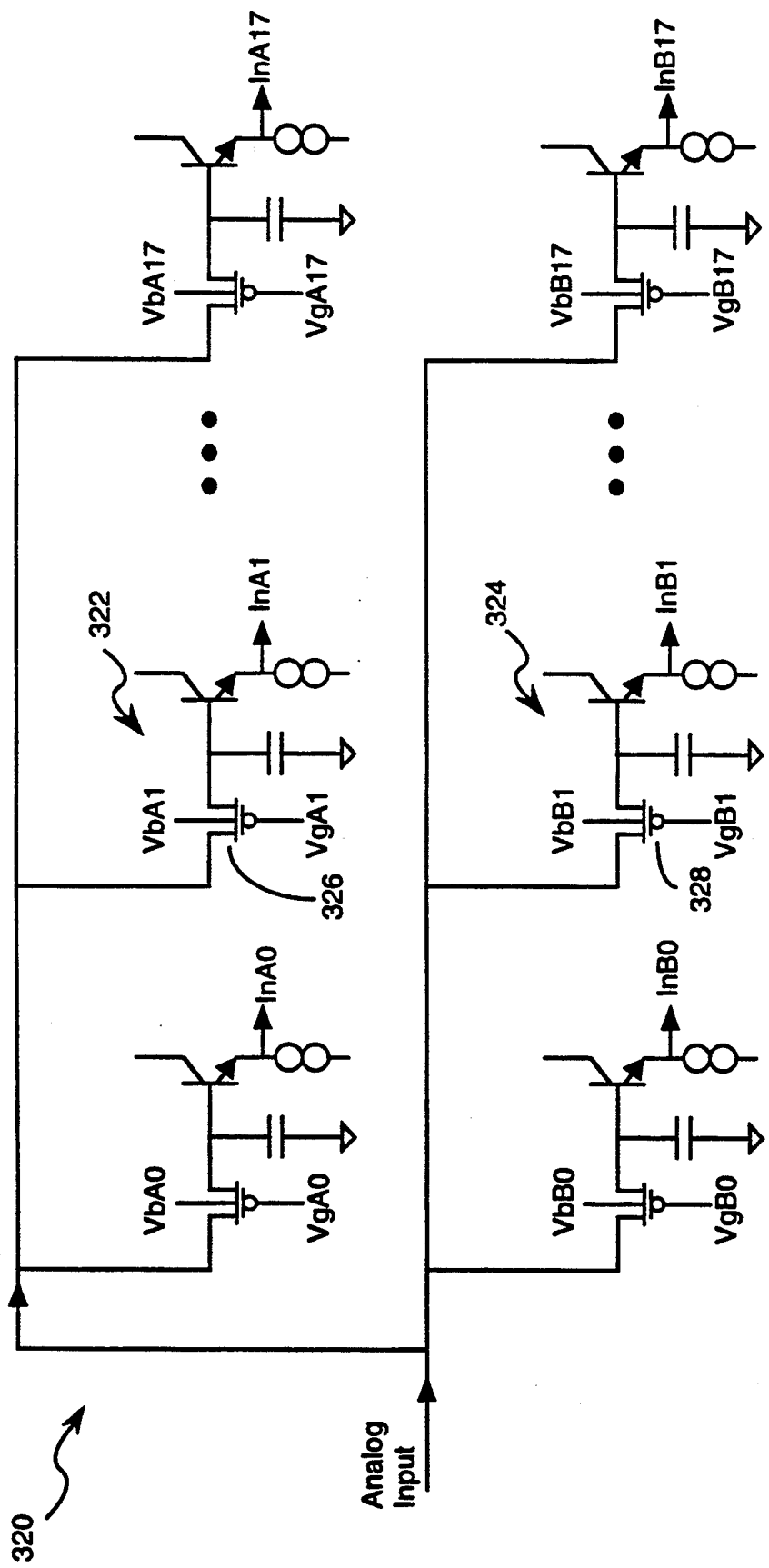

Referring to FIG. 9A, there is shown a circuit diagram of a preferred embodiment 320 of the inventive analog sample and hold voltage receiver. The receiver 320 is operative to provide each stage of a folder circuit 330 (FIG. 10A) with samples of an analog input voltage. In particular, a first sample and hold circuit 322 of the voltage receiver 320 provides transistor Q1A of folding Stage A1 (FIG. 10A) with a sample of the analog input voltage denoted by InA1. Similarly, a second sample and hold circuit 324 supplies transistor Q1A of folding Stage B1 within folder 332 (FIG. 10B) with analog input sample InB1. In keeping with the present invention, bias voltages VbA1 and VgA1 provided to circuit 322 and bias voltages VbB1 and VgB1 applied to circuit 324 are selected such that the channel resistances of the sampling transistors 326 and 328 are identical for analog inputs in the vicinity of the folding points associated with Stages A0 and B1 (FIG. 10A and 10B), respectively. That is, the bias voltages applied to the circuits 322 and 324 cause the channel resistance of transistor 326 (for analog input voltages proximate 48 LSB) to be equivalent to the channel resistance of transistor 328 (for analog input voltages proximate 16 LSB).

Figure 9B:
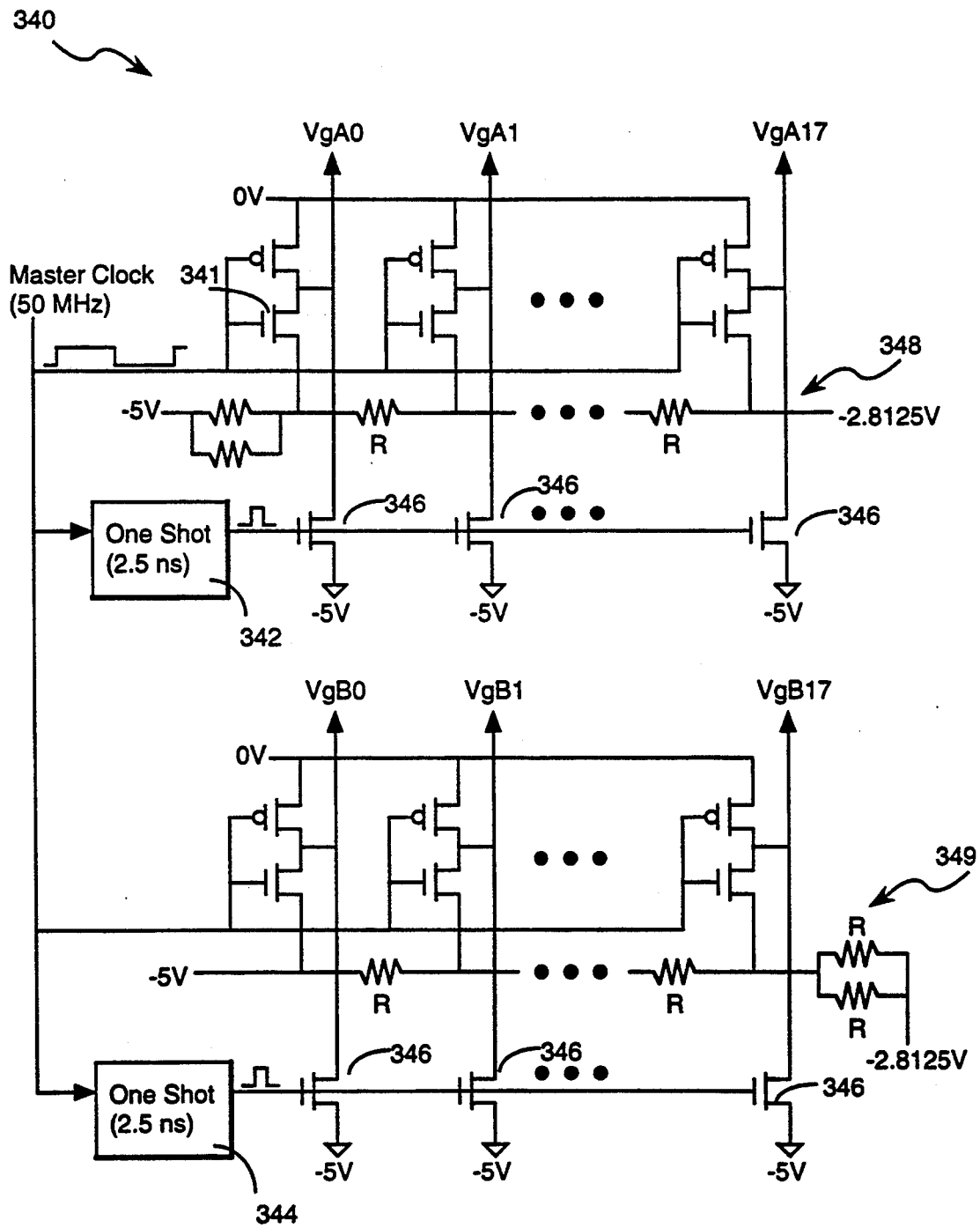

FIG. 9B is a schematic representation of a clocked gate bias circuit 340 operatively connected to the sampling transistors within the voltage receiver 320 (FIG. 9A). The bias circuit 340 is operative to control the sampling process effected by the receiver 320 by toggling the gate bias applied to each sampling transistor in accordance with a 50 MHz Master Clock. As can be seen from inspection of FIG. 9B, the bias lines on which are impressed gate bias voltages VgA0–17, VbB0–17 are pulled high, to 0 volts, when the Master Clock signal goes low for 10 nanoseconds. This disables all the sampling transistors in the receiver circuit 320. During this time, the previously sampled input voltages are converted to a digital value by the folder, flash array and decoder circuits of the ADC.

When the Master Clock signal goes high for 10 nanoseconds, NMOS transistors 341 within bias circuit are turned on, causing the bias lines on which are impressed gate bias voltages VgA0–17, VbB0–17 to be pulled low, to voltages ranging between −5 volts and −2.8125 volts high. Transistors 341 are actuated in response to Master Clock rising to a logical high during each 10 nanosecond sampling interval. The transition of the gate bias lines to a negative potential is expedited by one-shot circuits 342 and 344, which issue short (2.5 nanosecond) pulses to briefly actuate NMOS transistors 346. In this way the gate bias lines VgAi and VgBi are pulled quickly from a potential of 0V toward a potential of −5V at the beginning of each sampling interval, and then settle down to an intermediate gate bias voltage determined by resistor ladders 348 and 349. As shown in FIG. 9B, the resistive ladders 348 and 349 are used to define the magnitude of each gate bias voltage VgA-0–17 and VgB0–17 applied to the voltage receiver 320 during each sampling interval. Referring to FIG. 9C, a similar resistive network within a substrate bias network 360 enables the provision of staggered bulk bias voltages VbA0–17 and VbB0–17.

LSB FLASH CIRCUIT USING REFERENCE FOLDER CIRCUITS

Figure 11:
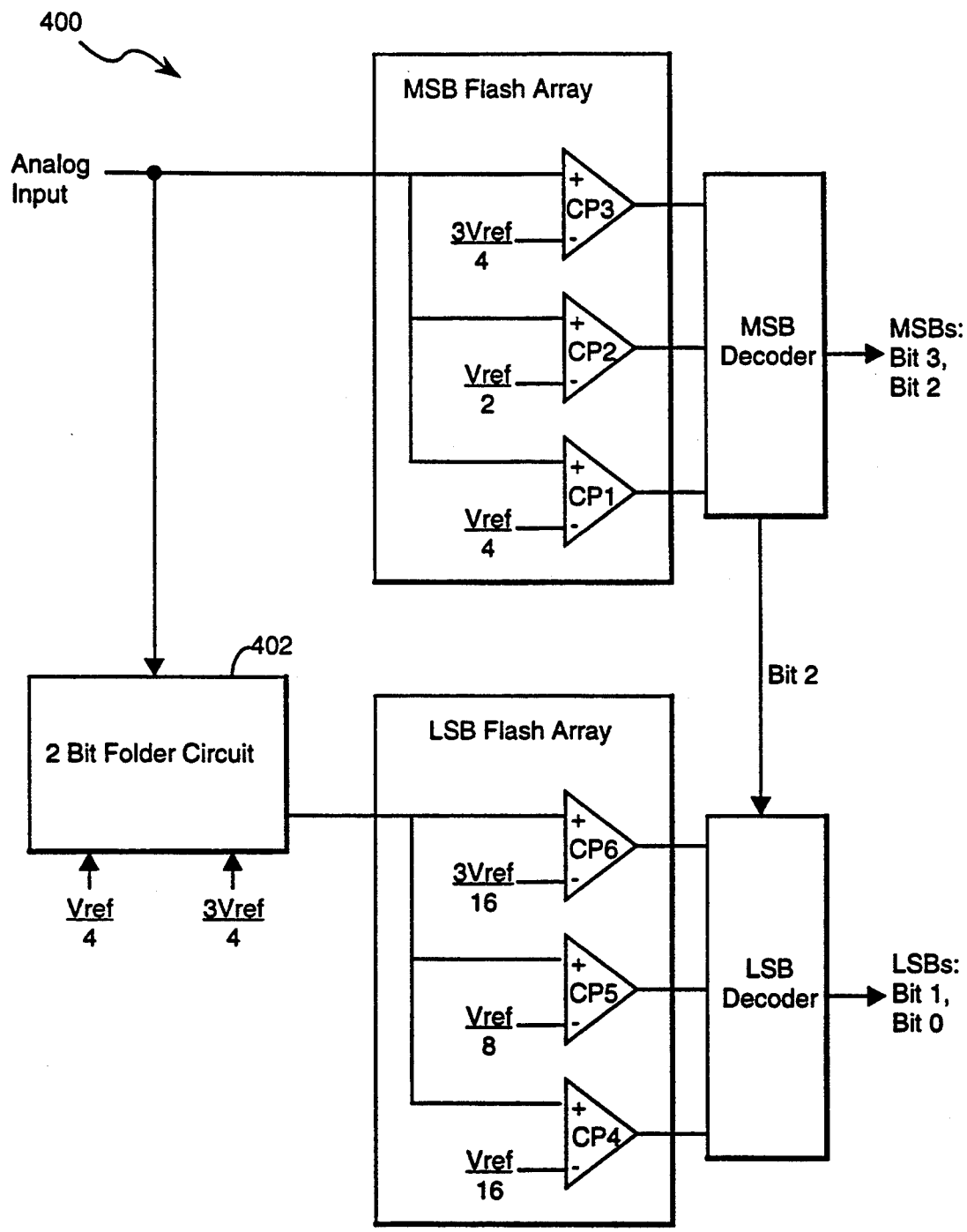
FIG. 11 is a block diagram of a conventional four-bit analog to digital converter using a folder circuit.
Figure 12:
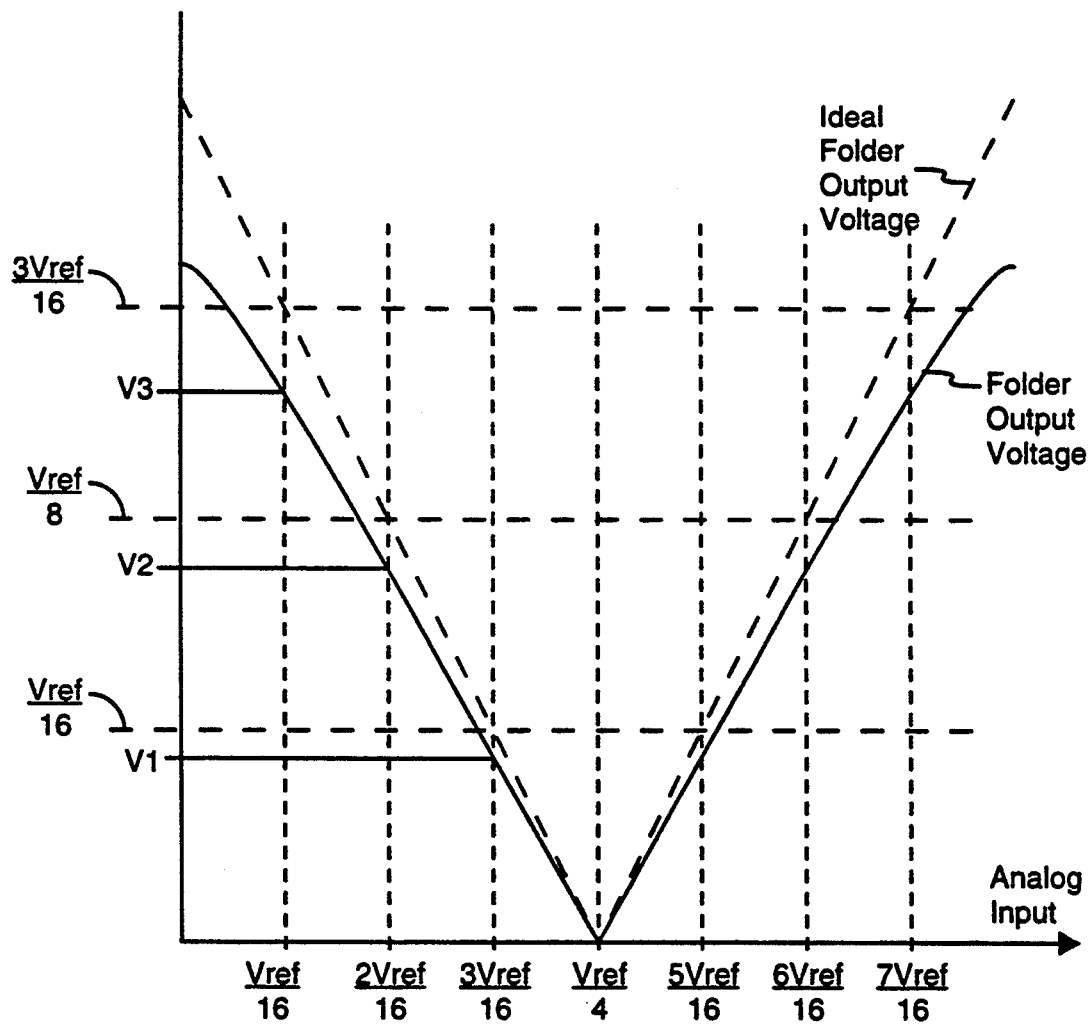
FIG. 12 represents the ideal and actual voltage transfer characteristics of the folder circuit depicted in FIG. 11.

Referring to FIG. 11, there is shown a block diagram of a conventional four-bit analog to digital converter (A/D) 400 incorporating a 2-bit folder circuit 402. As mentioned above, the accuracy of conventional folding A/D's depends in part upon the degree to which the folder circuit is capable of implementing a piecewise linear folding function. In this regard FIG. 12 represents a first portion of the ideal (dashed line) and actual (solid line) voltage transfer characteristics of the 2-bit folder circuit 402 incorporated within the A/D 400. As is indicated by FIG. 12, error is introduced into the folder output voltage as a consequence of deviation in the actual folder transfer characteristic from an ideal piecewise linear characteristic. For example, an analog input voltage of 3Vref/16 would ideally be mapped by the folder circuit of FIG. 11 to a folder output voltage of Vref/16. Instead, the nonlinear folder transfer characteristic results in an analog input of 3Vref/16 being converted to an output voltage V1 of less than desired magnitude.

Existing techniques for improving the linearity of the actual folder transfer characteristic have incorporated emitter feedback resistors within the differential pair of the folder. These feedback resistors improve linearity by degenerating base-emitter voltage drop, which in turn limits collector current and reduces rounding of the actual folder transfer characteristic. Unfortunately, this technique requires matching an additional pair of resistors (the emitter resistors) and reduces the gain of the folder. In addition to being relatively nonlinear even under stable environmental conditions, the transfer characteristics of conventional folder circuits also tend to vary as a function of temperature and processing. Accordingly, satisfactory operation of folder circuits may generally be achieved only over a limited temperature range.

The present invention provides a technique for improving the linearity of folder transfer characteristics, both under stable and fluctuating environmental conditions, which does not engender an accompanying gain reduction. As discussed below, this technique involves adjusting the reference voltages applied to comparators (comparison voltages) within a flash array so as to mirror variation in the voltage provided to the array by a primary folder circuit. Specifically, reference folders having transfer characteristics substantially identical to that of the primary folder circuit are utilized to generate the comparison voltages. The reference folders thus serve to compensate for variation in the gain of the primary folder, and in this way obviate the need to design the primary folder for constant gain and absolute linearity over temperature.

Figure 13:
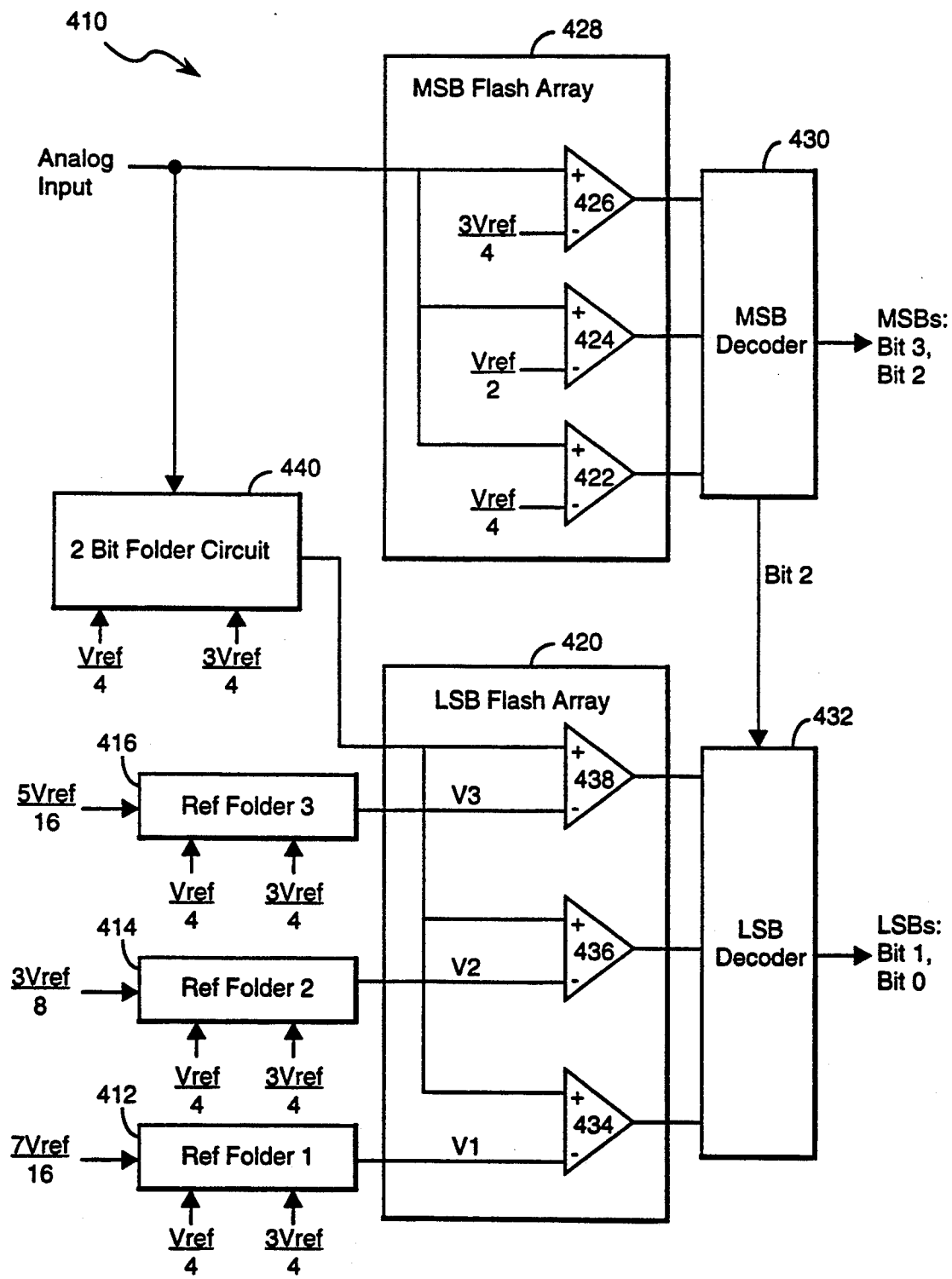
FIG. 13 is a block diagram of an improved four-bit analog to digital converter using reference folder circuits to provide reference voltages to a flash array.

Referring to FIG. 13, there is shown a block diagram of an improved four-bit analog to digital converter 410 of the present invention which includes first, second and third reference folder circuits 412, 414 and 416 for providing comparison voltages V1, V2, and V3 to an LSB flash array 420.

As shown in FIG. 13, the two most significant bits (MSB's) generated by the converter 410 are produced by applying the analog input to first, second and third MSB comparators 422, 424, and 426 within an MSB flash array 428. The comparators 422, 424, and 426 are respectively referenced to comparison voltages Vref/4, Vref/2 and 3Vref/4 provided by, for example, a resistive reference ladder (not shown). An MSB decoder 430 is operative to synthesize the two MSB's generated by the converter 410, i.e., Bits 2 and 3, in response to the binary output of the MSB flash array 428.

As shown in FIG. 13, the LSB's, i.e., Bits 0 and 1, generated by the converter 410 are produced by an LSB decoder 432 in response to the binary output of the LSB flash array 420. The LSB flash array 420 includes first, second and third comparators 434, 436 and 438 respectively referenced to the first, second and third comparison voltages V1, V2 and V3 by the reference folders 412, 414 and 416. The transfer characteristics of the reference folders 412, 414 and 416 are made to be substantially identical to that of a primary folder 440 so as to compensate for variation in the output voltage of folder 420 induced by, for example, temperature fluctuation or the like. In accordance with the invention, this identity between transfer characteristics is achieved by designing the reference folders to be duplicates of corresponding stages of the primary folder 440. For example, when the primary folder 440 is implemented using a folder having a topology equivalent to that shown in FIG. 6, the first reference folder may be realized as shown in FIG. 14.

Figure 14:
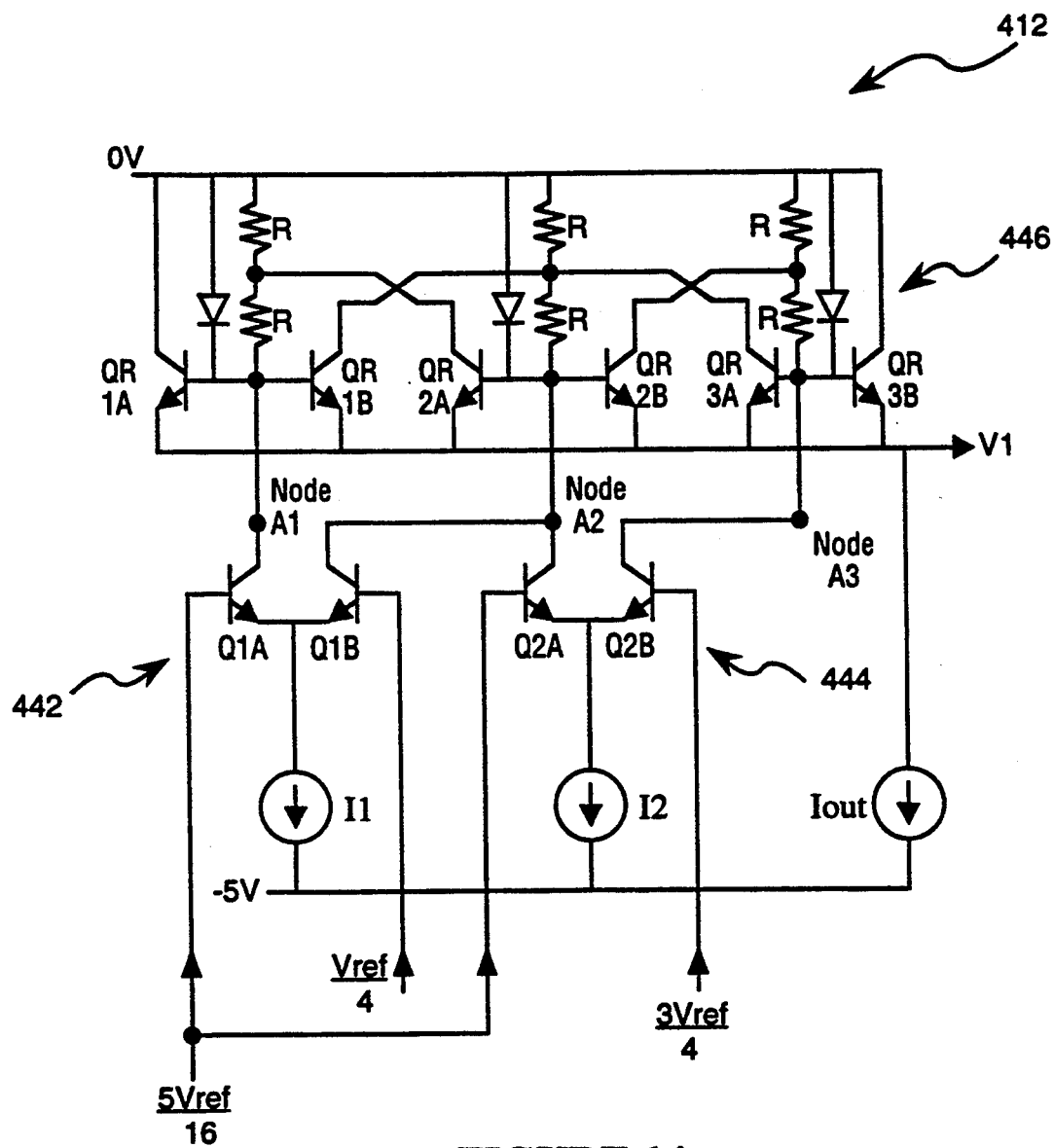
FIG. 14 is a circuit diagram of a reference folder circuit used in a preferred embodiment of the present invention.

Referring to FIG. 14, the first reference folder 412 includes a first differential stage 442 comprised of transistors Q1A and Q1B, and a second differential stage 444 which includes transistors Q2A and Q2B. Equivalent current sources I1 and I2 fix the current through stages 442 and 444, while an output current source Iout sets the current through an output network 446. As was discussed with reference to FIG. 6, the output voltage of folder 412, i.e, the comparison voltage V1, is defined by the output network 446 on the basis of node voltages A1, A2 and A3. In the implementation of FIG. 14 the application of a reference voltage of 5Vref/16, derived from a reference ladder (not shown), to differential stages 442 and 444 results in the provision of a comparison voltage V1 of approximately 3Vref/16. Again, it is a feature of the present invention that the magnitude of voltage V1 varies so as to compensate for fluctuations in the output voltage of the primary folder 440.

Reference folders 414 and 416 are substantially identical to the reference folder 412 shown in FIG. 14, except that the "input reference voltages" applied to reference folders 414 and 416 are 3Vref/8 and 7Vref/16, respectively.

Figure 15A:
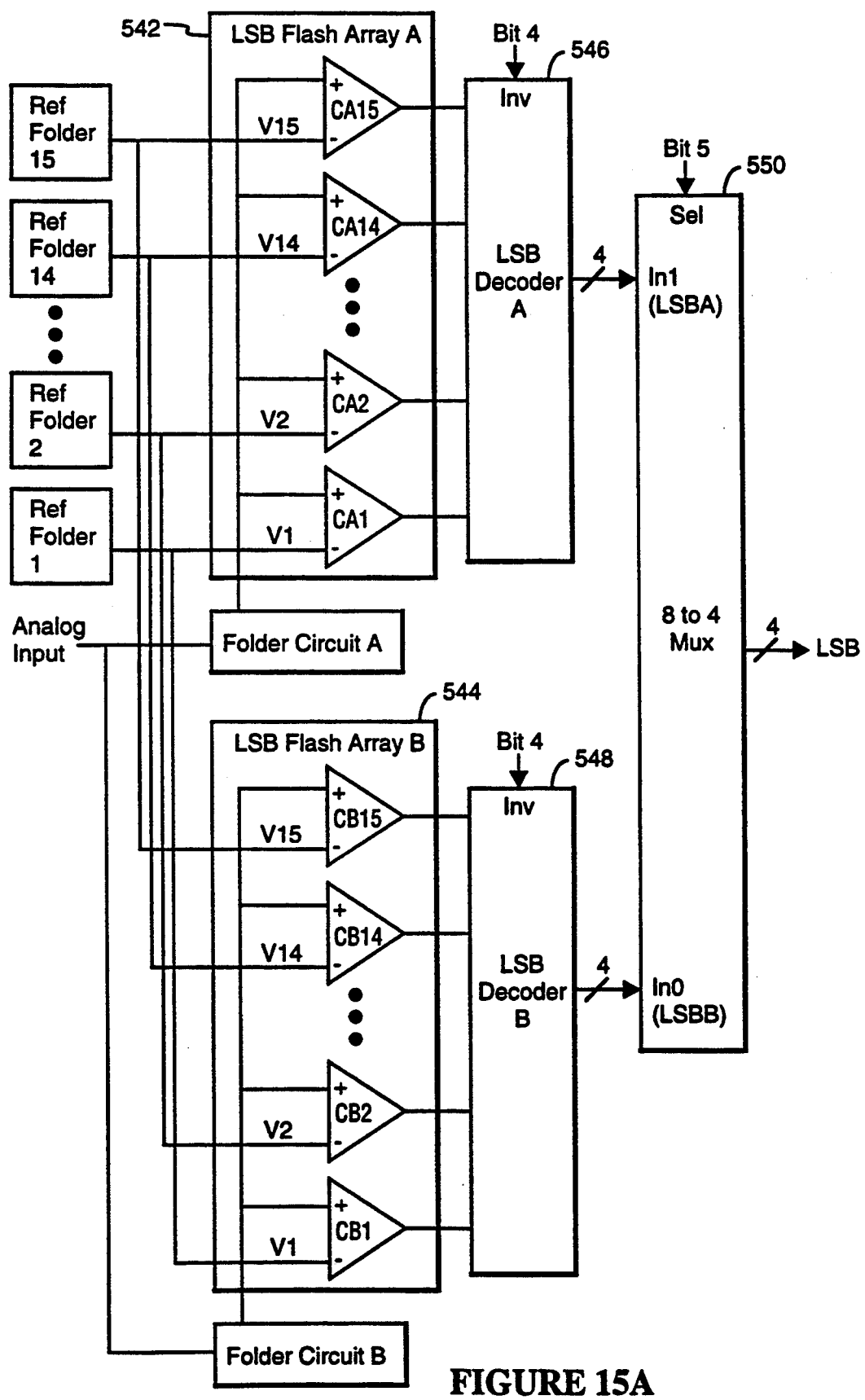
FIG. 15A is a block diagram of the LSB conversion circuitry, incorporating fifteen reference folders in a preferred 10-bit ADC embodiment of the present invention.

FIG. 15A shows a preferred implementation of an LSB flash army supplied with comparison voltages from a set of fifteen reference folders. The LSB flash array is bifurcated into an LSB flash army A coupled to 4-Bit Folder Circuit A, and an LSB flash array B responsive to the output of 4-Bit Folder Circuit B. The Folder Circuits A and B, in conjunction with LSB Decoders A and B, provide binary inputs to an 8-to-4 Multiplexer. In this arrangement the output of the 8-to-4 Multiplexer corresponds to the four LSB's of a 10-Bit representation of the analog input applied to Folder Circuits A and B.

Figure 10A:
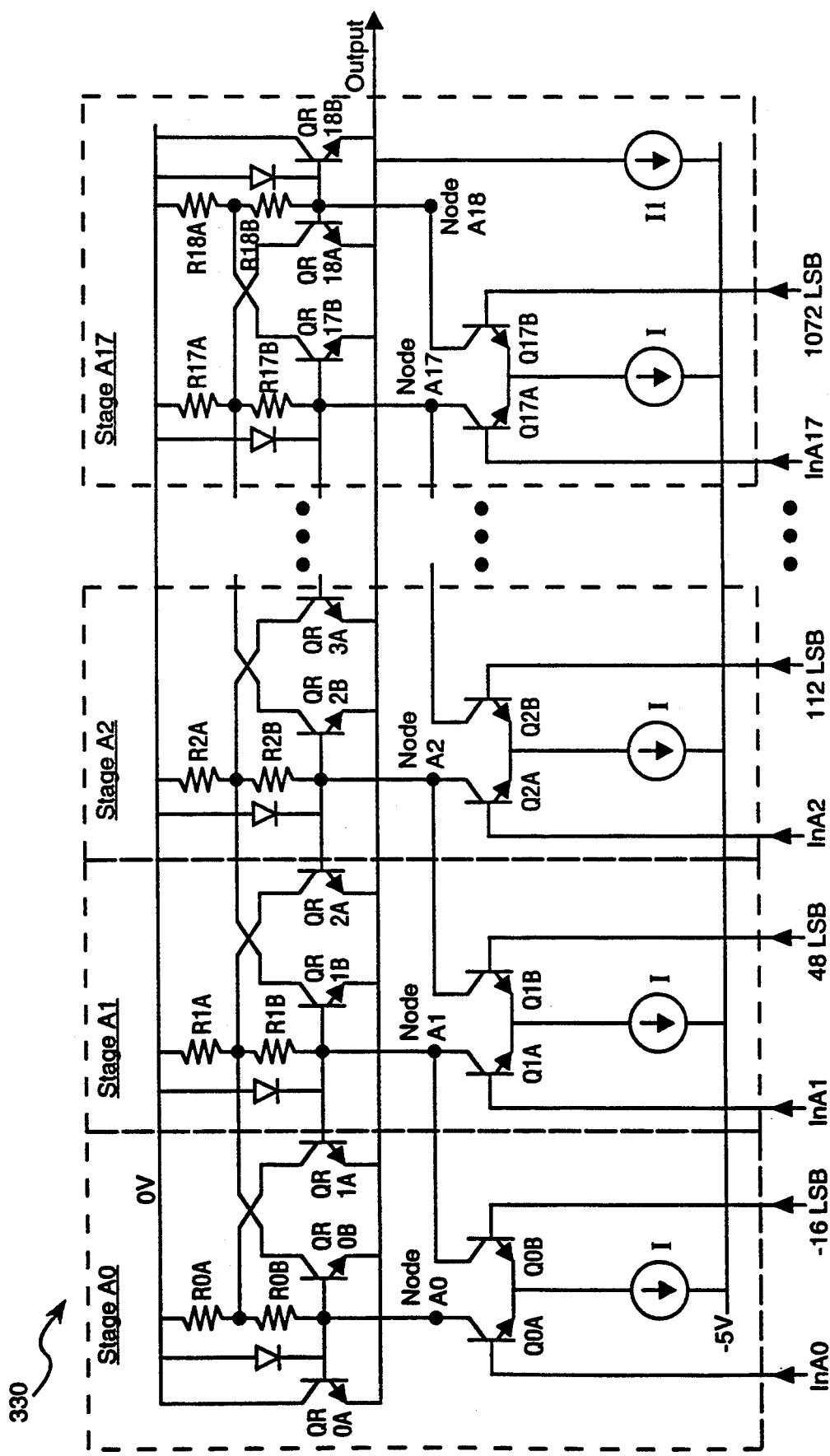
FIGS. 10A and 10B are circuit diagrams of 4-bit folder circuits used in conjunction with the sample and hold voltage receivers of FIGS. 9A–9C.
Figure 10B:
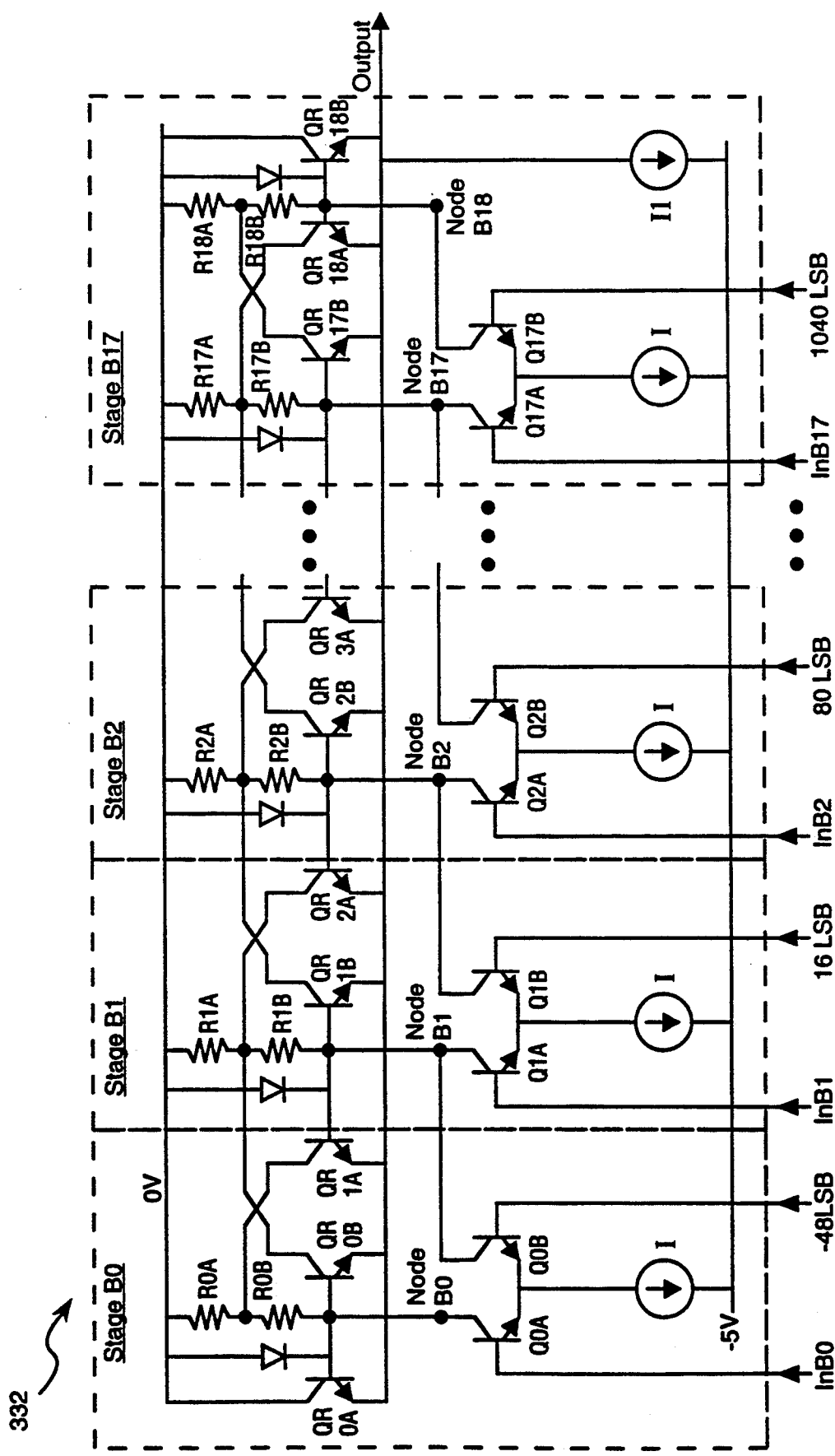
Figure 15B:
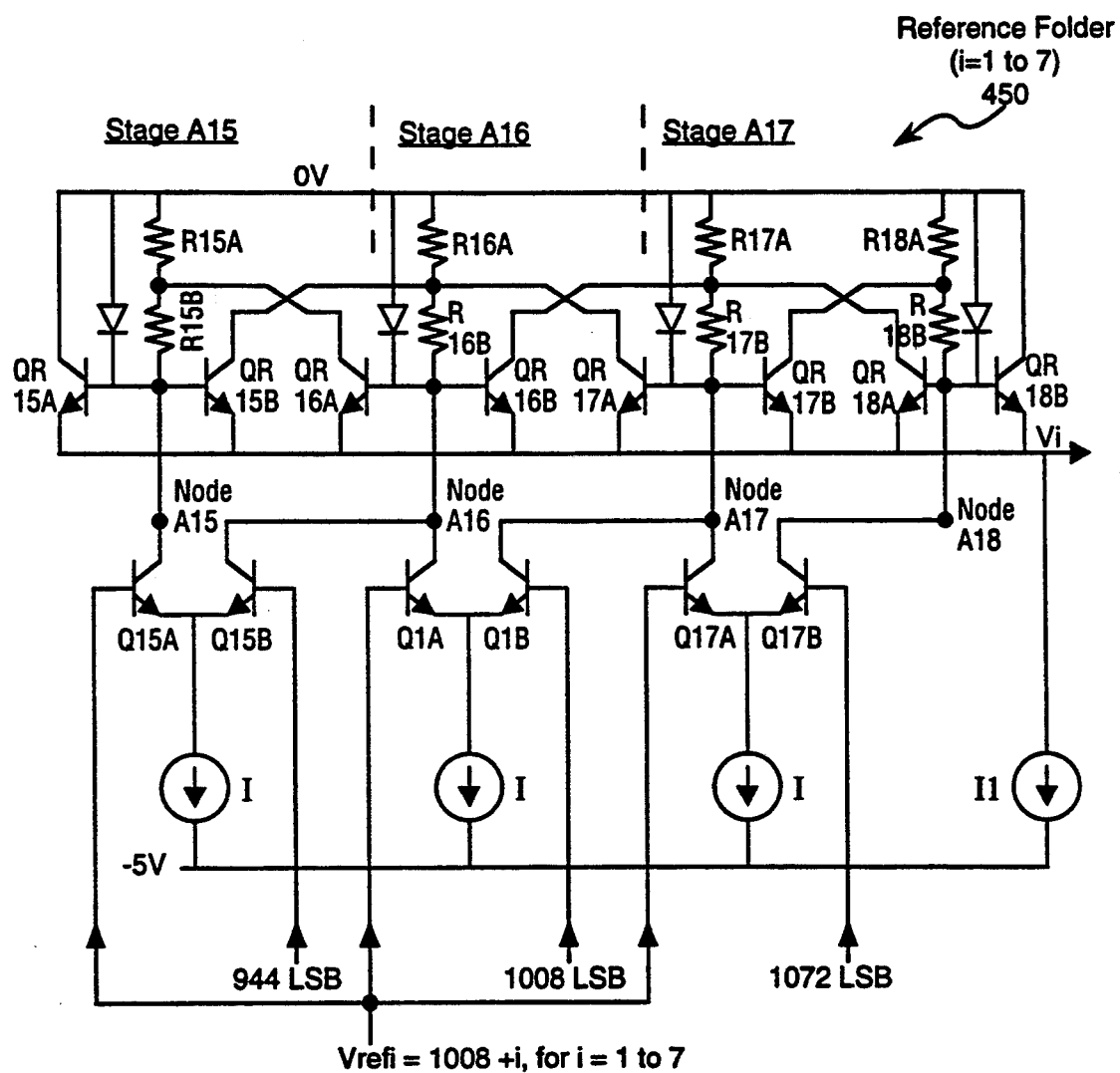
FIGS. 15B and 15C are circuit diagrams of the reference folders used in the preferred 10-bit ADC.
Figure 15C:
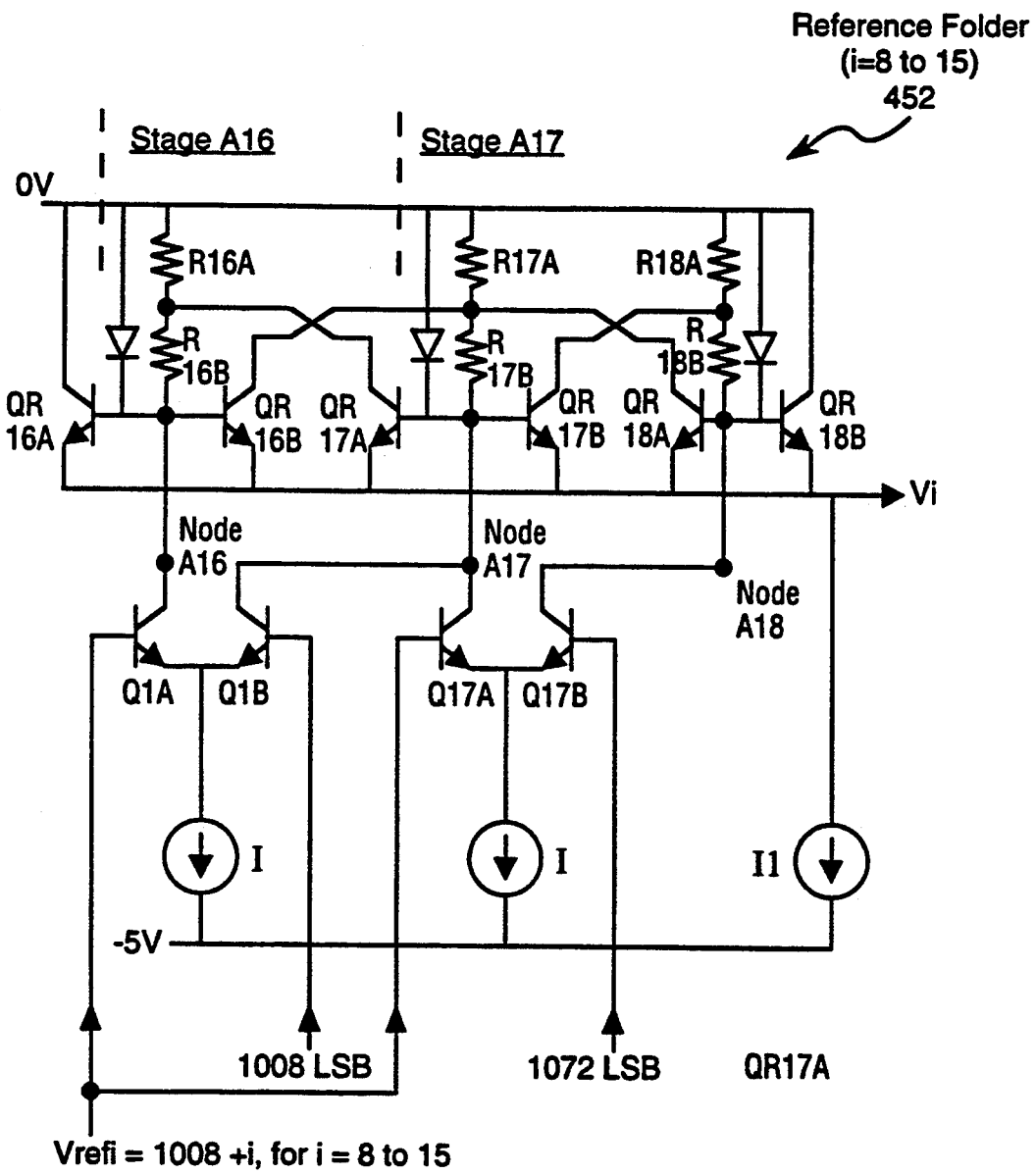

The two Folder Circuits A and B are shown in more detail in FIGS. 10A and 10B. The fifteen reference folders in FIG. 15A are shown in FIGS. 15B and 15C. The first seven reference folders, shown in FIG. 15B, are implemented as three-stage folder circuits 450 that are identical except for the "input reference voltages" which are offset from a folder reference point by voltages ranging from 1 LSB to 7 LSB. The remaining eight reference folder circuits, shown in FIG. 15C, are implemented as two-stage folder circuits 452 that are identical to each other except for the "input reference voltages" which are offset from a folder reference point by voltages ranging from 8 LSB to 15 LSB.

The reason three folder stages are used in the first seven reference folder circuits 450 but not the other eight reference folder circuits 452 is as follows. For the lowest input reference voltages, the A15 stage of the reference folder in FIG. 15B still has a measurable affect on the currents drawn through resistor R16A–R16B, causing the output voltage of the folder circuit to be lower than if stage A15 were not present. This affect is partially responsible for the non-linear shape of the voltage transfer characteristic near the folding points. However, this affect is so attenuated as to be insignificant for the higher input reference voltages because the Q15A base voltage rises high enough to cause the current through transistor Q15B approaches zero.

VOLTAGE REFERENCE LADDER

Figure 4:
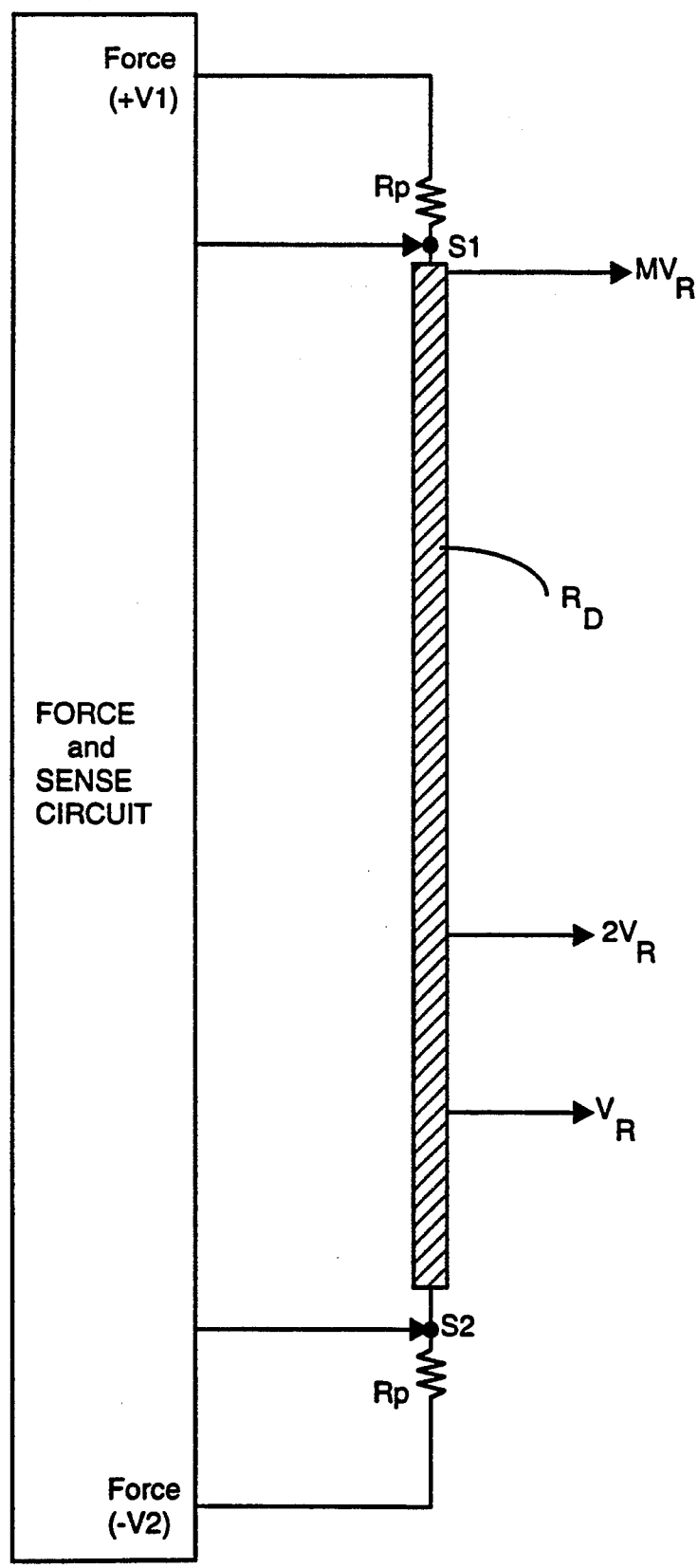
FIG. 4 is a circuit diagram of a resistor ladder, in conjunction with a conventional external force and sense circuit, for generating reference voltages.

As was discussed in the Background of the Invention, efforts have been made to enhance the precision of the reference voltages supplied to the flash arrays and folder circuits included within high-speed ADCs. For example, in the conventional approach shown in FIG. 4, a force and sense circuit is employed to set the voltage at sense terminals at either end of a resistive line to predefined reference potentials. Specifically, the force and sense circuit includes a feedback network which adjusts the magnitude of applied "force" voltages such that the magnitude of the predefined reference potentials are made to be relatively independent of parasitic resistance proximate the termination of the resistive line.

In many analog to digital converters these reference potentials correspond to the zero and full-scale values used during the conversion process. In the preferred embodiment, which is a high-speed ADC, it is useful to include folding circuits having internal voltage references that are several LSBs beyond these zero and full-scale values. Simply increasing the dynamic range between the zero and full-scale values to include these additional reference voltages has been considered, but would lead to unusual values for the zero and full-scale references. This would, in turn, complicate the interpolation process used to select the tap points corresponding to the remaining reference values. Accordingly, one object of the present invention is to provide a voltage reference ladder from which may be derived reference voltages external to the voltage range defined by the reference potentials.

Figure 5:
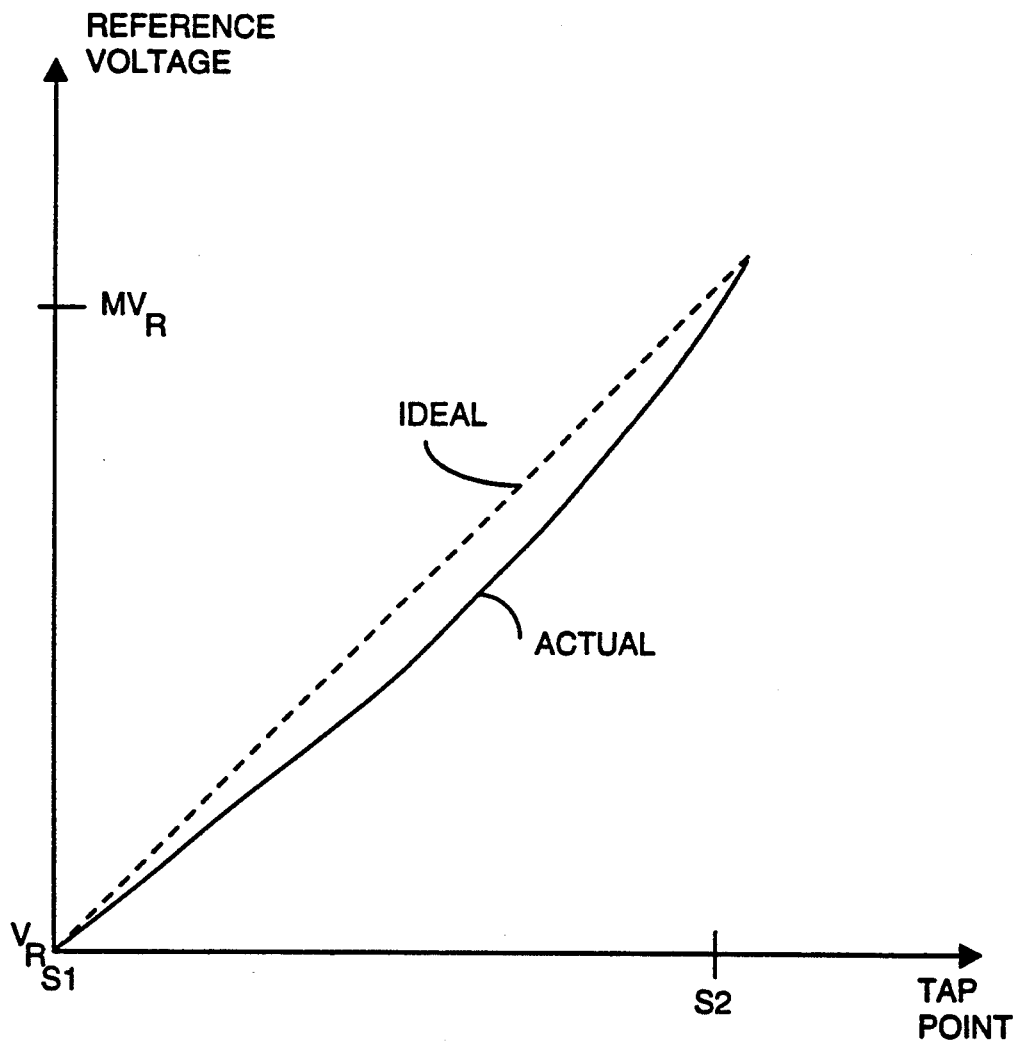
FIG. 5 is a graph depicting the actual-and ideal relationships between the locations of tap points along a resistive line and the corresponding reference voltages derived therefrom.

Referring to FIG. 5, the accuracy of the interpolated reference voltages derived from the resistive line of conventional reference ladders is degraded by current drawn by the circuits coupled to the reference voltage tap points. Hence, another object of the present invention is to minimize the error introduced into the interpolated reference voltages which arises as a consequence of current drawn by the folder and flash circuits of the ADC.

Figure 16:
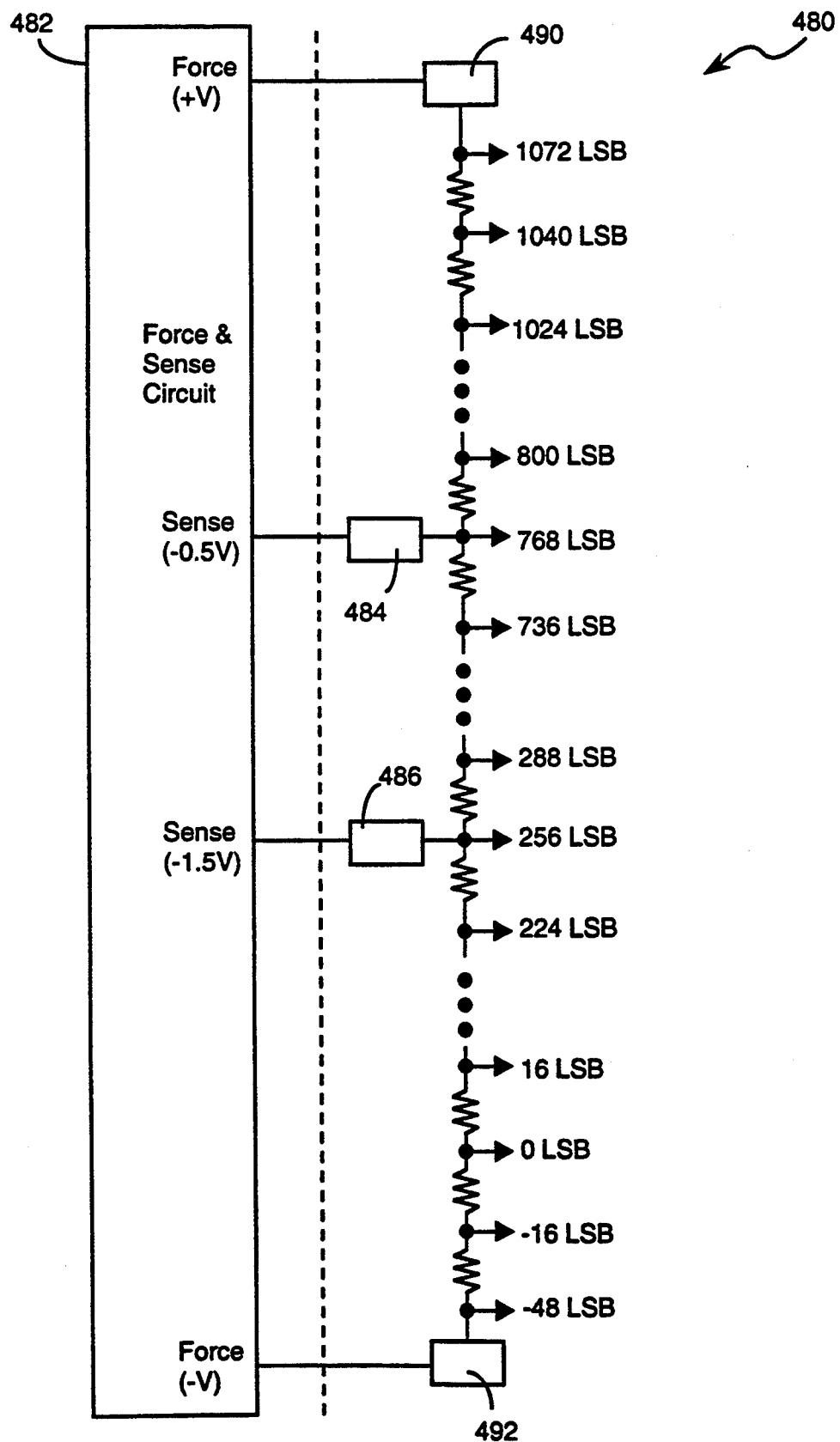
FIG. 16 is a circuit diagram of a resistor ladder 500 for generating reference voltages, and an external force and sense circuit 502 used in a preferred embodiment of the present invention.

FIG. 16 is a circuit diagram of a resistor ladder 480 for generating reference voltages, and an external force and sense circuit 482 used in a preferred embodiment of the present invention. A suitable force and sense circuit for use in the present invention is the HP4142 made by Hewlett-Packard. The ladder 480 may comprise a uniform resistive line or diffusion line from which a set of reference voltages may be derived from a set of taps positioned along the line. Alternatively, the ladder may be realized using a string of resistive elements connected in series. In the implementation of FIG. 16 a set of reference voltages stepped in increments of 32 LSB (plus a few other additional reference voltages for the inputs to the reference folders, and so on) are obtained by tapping a resistive metal ladder 480 at evenly spaced tap points.

In the preferred embodiment, the reference voltages are included within a range defined by references corresponding to −48 and 1072 LSB tapped from first and second ends of the resistive ladder 480, respectively. When the sense points are located at 0 LSB and 1024 LSB, the reference voltages may be segregated into a set of interpolated reference voltages (0 to 1024 LSB), a first set of extrapolated reference voltages (1025 to 1072 LSB), and a second set of extrapolated reference voltages (−48 LSB to −1 LSB).

In contrast to conventional approaches, in the implementation of FIG. 16 first and second sense terminals 484 and 486 are displaced from the first and second ends of the resistive ladder 480. The force and sense circuit 482 includes first and second force terminals 490 and 492 respectively connected to first and second ends of said resistive line 480. A voltage generator (not shown) within the circuit 482 impresses first and second reference potentials upon the first and second force terminals 490 and 492 until voltages on the first and second sense terminals 484 and 486 match predefined first and second voltage levels.

When the resistive ladder 480 is used within a folding analog to digital converter, the predefined first and second voltage levels may be selected to correspond to the converter's zero and full-scale reference voltages, e.g., −2V and 0V. This placement of the first and second sense terminals allows first and second sets of extrapolated reference voltages to be obtained by tapping the portions of the resistive line not included between the terminals 484 and 486. These extrapolated reference voltages can be used to provide voltage references to a folding analog to digital converter which requires references several LSBs beyond the zero and full-scale voltages. In integrated circuit applications the resistive ladder 480 will generally be realized as a uniform resistive diffusion, with other functional circuit elements being connected to the ladder at specified ones of the tap points associated with the set of LSB reference potentials (FIG. 16). In such implementations the LSB reference tap points will be uniformly spaced along the length of the diffusion.

In a first preferred embodiment of the present invention (shown in FIG. 16), the two sense points used are moved inward to points such as 256 LSB and 768 LSB. By forcing these two tap points of the resistive ladder to be precisely at their ideal voltages, the RMS error of the ladder is decreased, relative to embodiments where the sense points are positioned at the converter's zero and full-scale reference voltages, because all tap points are closer, on average, to the sense points. Thus, this embodiment produces a very small RMS error, while still using only two externally accessible sense points along the resistive ladder.

Figure 17:
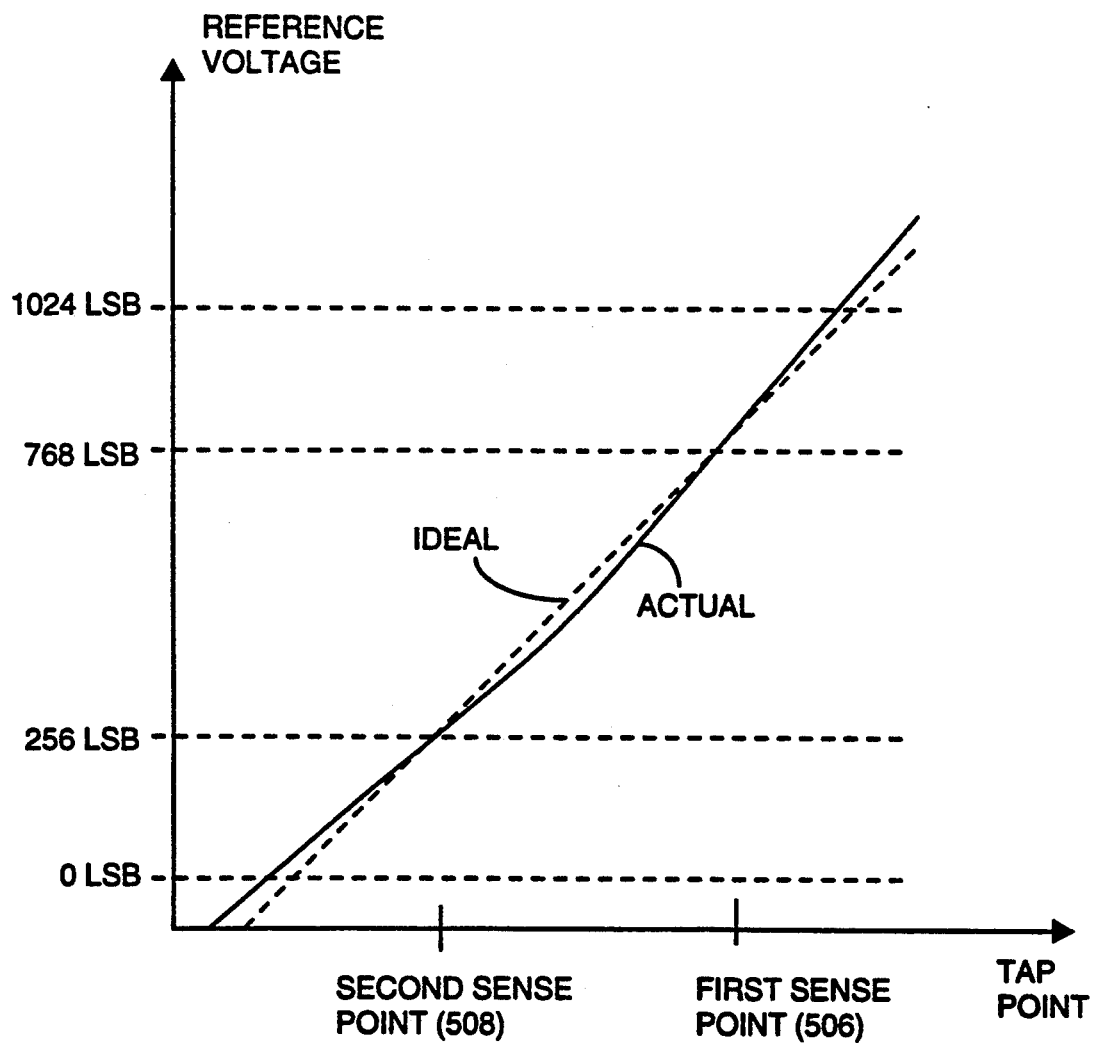
FIG. 17 is a graph depicting the actual and ideal reference voltages derived from a voltage reference ladder of the present invention.

As may be appreciated by reference to FIG. 17, displacement of the sense points associated with sense terminals 484 and 486 from the ends of the ladder 480 in accordance with the invention results in lower root-mean-square (RMS) error with respect to an ideal linear characteristic than is conventionally obtained. Note that the voltage deviations in typically ADC reference ladders are smaller than that shown in FIGS. 5 and 17, where the curvature of the voltage reference plot has been increased for purposes of explaining the present invention. With that caveat, comparison of FIG. 5 and FIG. 17 reveals that the curve representative of the actual reference potentials (solid line in FIG. 17) derived from the ladder 480 has been shifted relative to the curve associated with the actual potentials obtained from a conventional reference ladder (solid line in FIG. 5). This shift significantly reduces both overall RMS error and the previously large errors associated with reference potentials derived from tap points proximate the center of the resistive line.

In an alternate embodiment of the present invention, the number of sense points is increased to three (or more), for example, by using sense points at the 0 LSB, 512 LSB and 1024 LSB tap points of the resistive ladder 480, which ideally should be at −2, −1 and 0 volts, respectively. In this embodiment, the voltage generator of the force and sense circuit 482 is set up to minimize the RMS error of the voltages at the three sense points (0 LSB, 512 LSB and 1024 LSB). This embodiment produces a very small RMS error, at the cost of one additional externally accessible resistive ladder tap point. In yet another embodiment, four sense points at the 0 LSB, 256 LSB, 768 LSB and 1024 LSB tap points are provided, allowing the user several choices as to the force and sense scheme used.

PARALLEL FOLDER AND LSB DECODER CIRCUITS

Figure 18:
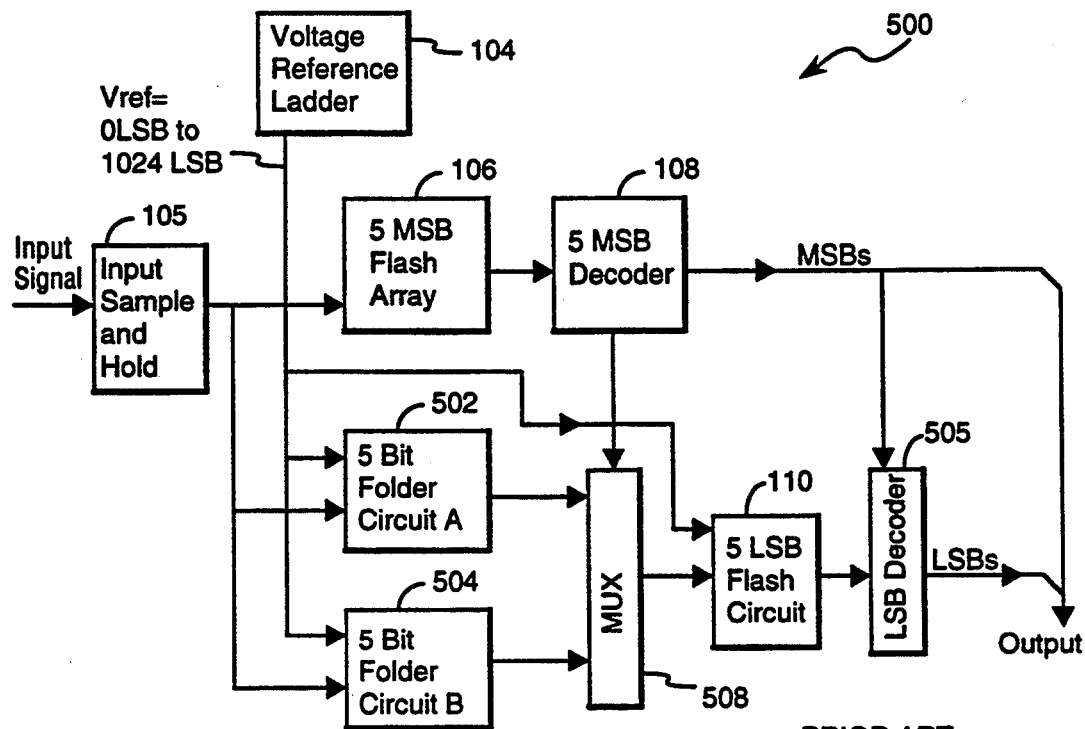
FIG. 18 is a block diagram of a prior art analog to digital converter using a pair of staggered folder circuits.

Referring to FIG. 18, there is shown a block diagram of a prior art 10-bit analog to digital converter 500 which uses a pair of staggered 5-bit folder circuits A and B, denoted respectively by reference numerals 502 and 504. During each sampling period an analog input signal (not shown) is sampled by the input sample and hold circuit 105 and applied to the 5-bit folder circuits 502 and 504, as well as to the conventional 5-bit MSB flash array 106. As is described below, the 10 Bit output of the converter 500 is generated by combining the five MSB's supplied by the 5-bit MSB Decoder 108 with a set of five LSB's provided by LSB Decoder 505.

Figure 1B:
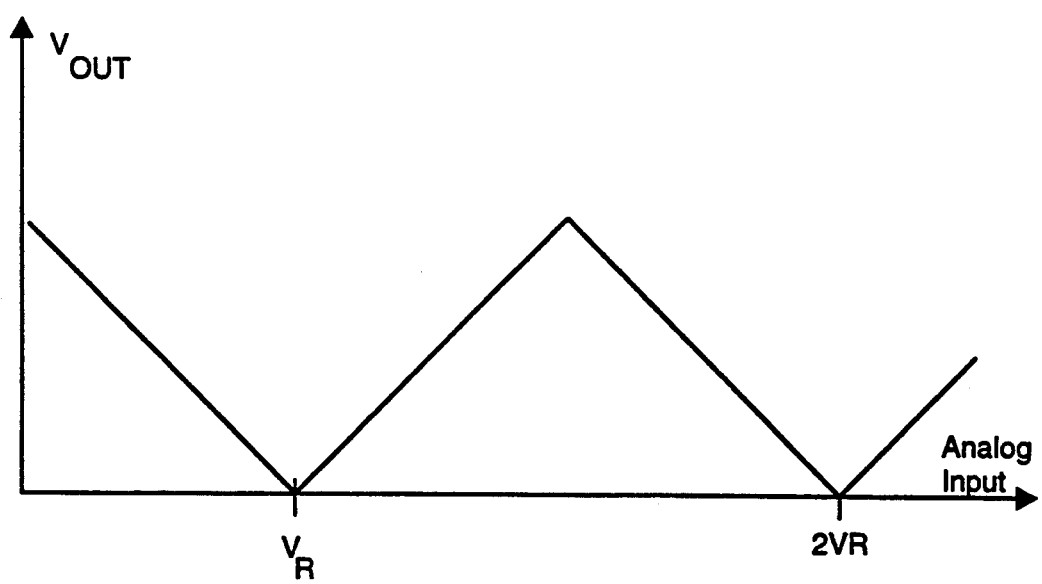
FIG. 1B graphically illustrates the ideal voltage transfer function of a conventional folder circuit.
Figure 2:
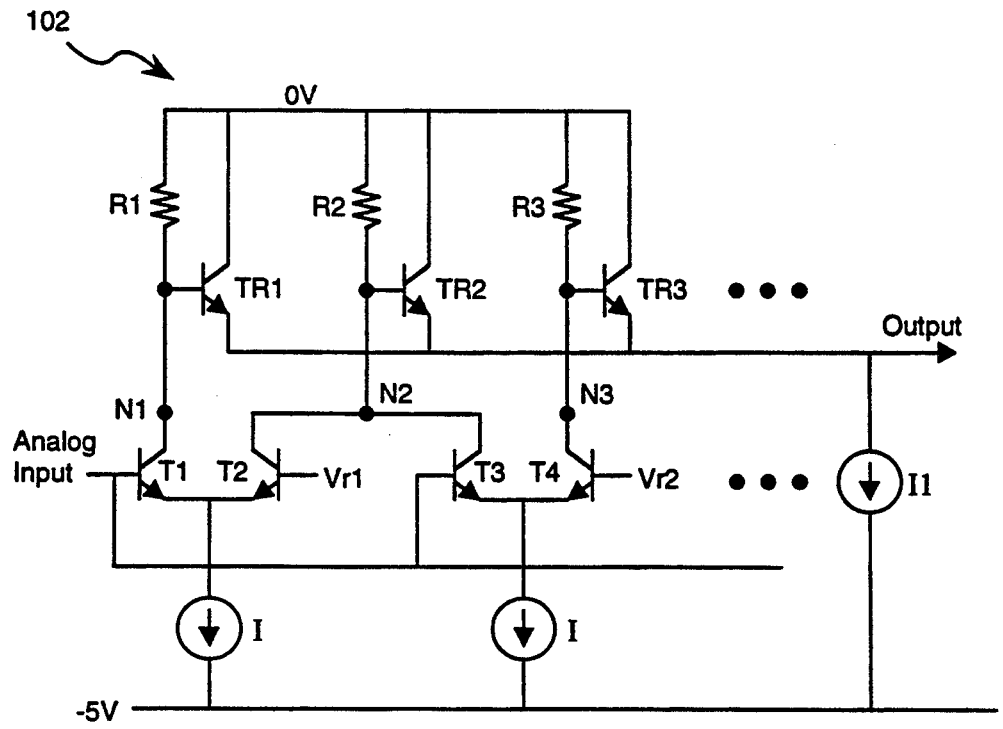
FIG. 2 is circuit diagram of a conventional folder circuit.

The output voltage of folder circuit 502 is derived by comparing the sampled analog input signal with a set of M reference voltages $V_R, 2V_R, \ldots MV_R$, provided by a voltage reference ladder 104. In the implementation of FIG. 18, the first folder circuit 502 operates in accordance with the folding transfer characteristic shown in FIG. 1B. The transfer characteristic of the folder circuit 504 is substantially similar to that shown in FIG. 1B, but is staggered therefrom by $V_R/2$. That is, the folding points of the transfer characteristic of folder circuit 504 are at $0.5V_R, 1.5V_R, \ldots (M+0.5)V_R$. This allows all input voltages to be mapped to a folder output voltage on the basis of the bottom half of the transfer characteristics of the folder circuits 502 and 504.

The appropriate folder output voltage to be used in generating the five LSB's output by the converter 500 is determined by the value of the second least significant bit of the 5 Bit MSB Decoder 108. This bit is supplied to the multiplexer 508 at the conclusion of the MSB conversion process. Unfortunately, the MSB conversion process requires more time than the folding operation performed by the folder circuits 502 and 504. This slows the overall rate of analog to digital conversion, since the 5 Bit LSB flash circuit 110 must wait until multiplexer 508 is provided with the least significant bit generated by MSB decoder 108 before converting the selected folder output voltage to digital form. Accordingly, it is an object of the present invention to improve the speed of analog to digital converters which employ staggered folder circuits by eliminating the requirement that the MSB conversion process be completed prior to converting one of the folder circuit outputs to a digital value.

Figure 19:
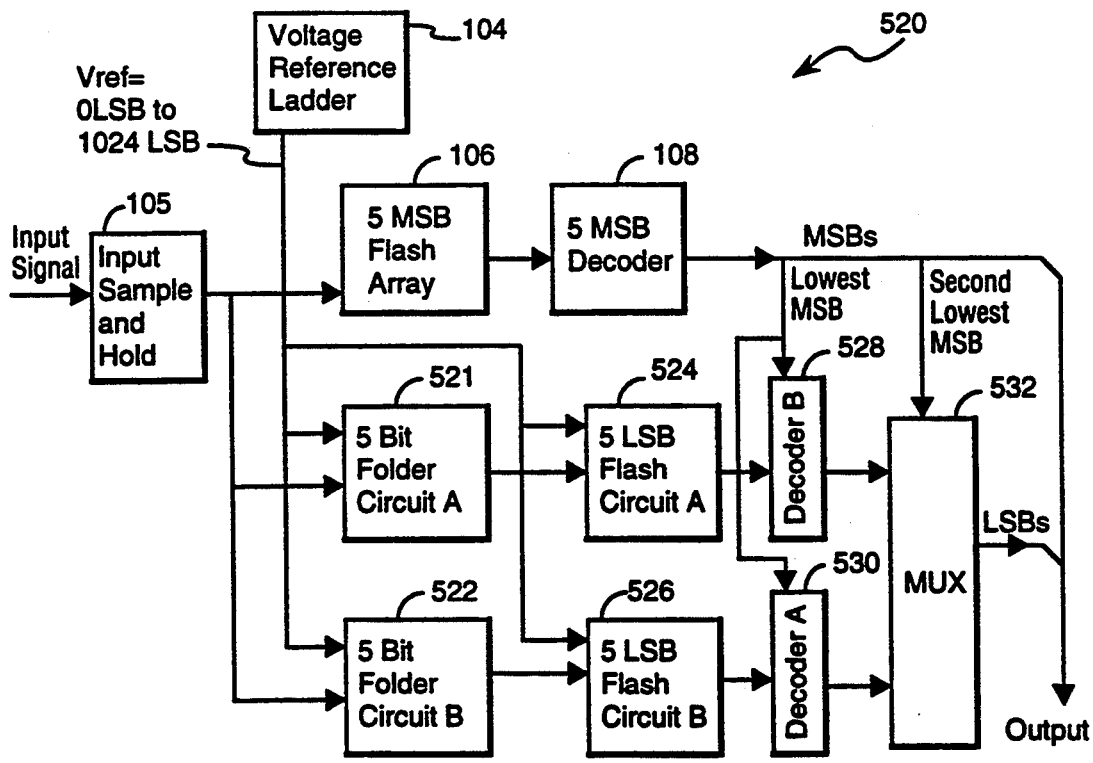
FIG. 19 is a block diagram of an analog to digital converter which incorporates parallel flash circuits and decoders in accordance with the present invention.

FIG. 19 is a block diagram of an analog to digital converter 520 which incorporates parallel flash circuits and decoders in accordance with the present invention. As shown in FIG. 19, a sampled analog input from the sample and hold circuit 105 is provided to the 5-bit MSB flash array 106 and to staggered folder circuits 521 and 522. A digital code corresponding to the five MSB's of the analog input is straightforwardly produced by the 5-bit MSB flash array 106, with the actual five binary code MSB's being provided by the MSB Decoder 108. Similarly, a binary output commonly termed "gray thermometer" digital code is generated by the 5-bit LSB Flash Circuits A and B, denoted by reference numerals 524 and 526, on the basis of the outputs of the folder circuits 521 and 522. This thermometer code is transformed into binary code by LSB Decoders A and B, represented by reference numerals 528 and 530, to yield a pair of 5-bit digital outputs provided to digital multiplexer 532. The digital output from the one of the decoders 528 and 530 which corresponds to the five LSB's output by the converter 520 is selected by the multiplexer 532 in accordance with the second least significant bit generated by the MSB Decoder 108. As is apparent from the foregoing, the LSB conversion process effected by the flash circuits 524 and 526 and decoders 528 and 530 may occur contemporaneous with the corresponding MSB conversion. This eliminates the delay in the LSB conversion process discussed with reference to the conventional analog to digital converter 500, since in accordance with the present invention the multiplexing operation is performed after the output voltages from the folder circuits 521 and 522 have been converted to digital form. In this way the present invention provides a technique for improving the speed of analog to digital converters employing staggered folding circuits.

The ADC 540 of FIG. 20, which will be described in more detail below, is a second embodiment of an ADC that incorporates parallel flash circuits and decoders.

Figure 3:
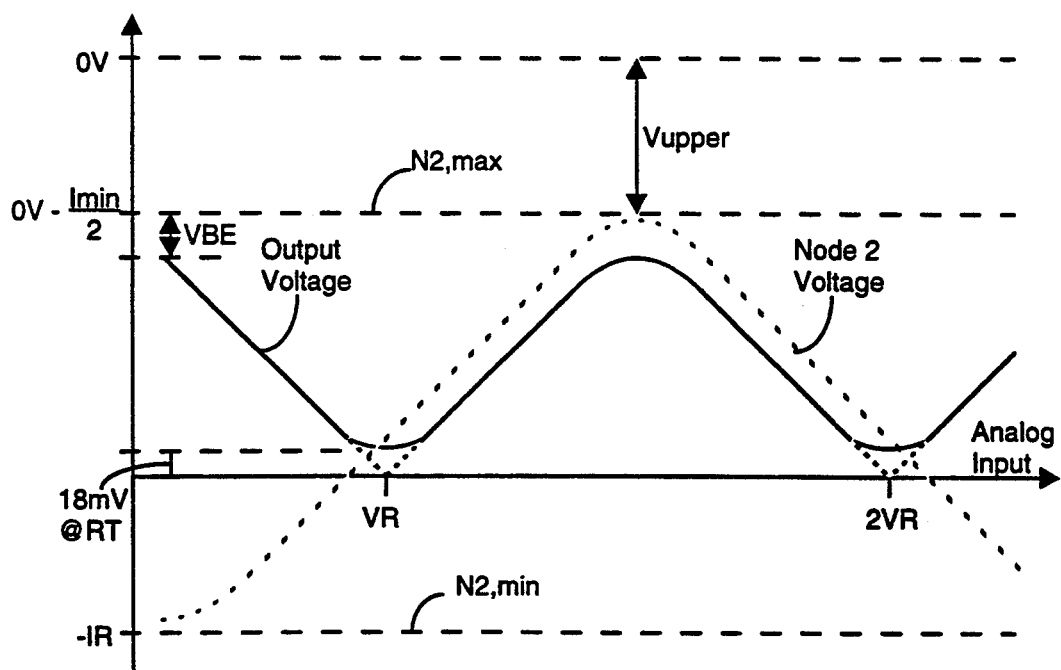
FIG. 3 represents the transfer function and voltage characteristics of the convention folder circuit of FIG. 2.
Figure 20:
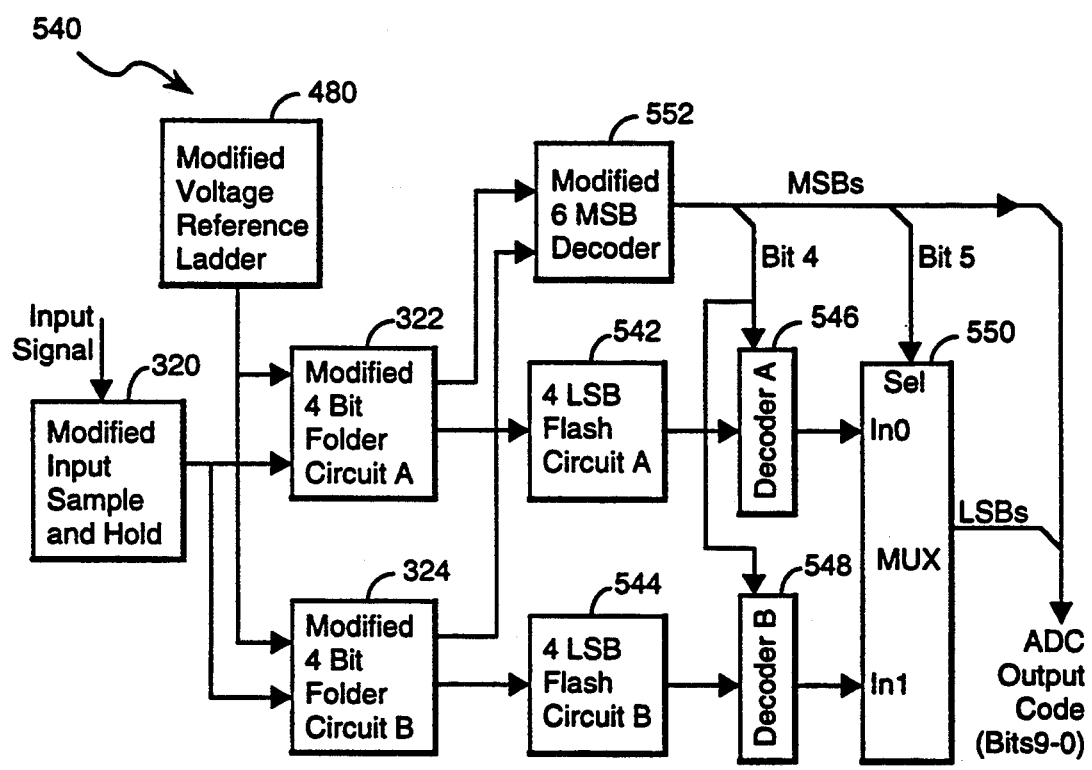
FIG. 20 is a block diagram of an analog to digital converter which incorporates parallel flash circuits and decoders, as well as a modified MSB decoder in accordance with the present invention.

A second problem addressed by the invention as shown in FIGS. 19 and 20 is that the folder transfer function is very curved (i.e., non-linear) near the tops of the transfer function, which are near the midpoints between the folding points of the folder circuit (i.e., between the voltage references used by the folder). As shown in FIG. 3, the gain near the maximum folder output points is very poor, making resolution of input voltages in these regions poor. This problem is solved in the present invention by using only the most linear portion of each folder's transfer function.

In the ADC of FIGS. 19 and 20, the two staggered folder circuits A and B (521 and 522) use only half as many folding points as would be required for a single folder circuit, using reference voltages in each folder circuit spaced at intervals of 64 LSB instead of at intervals of 32 LSB in the case of the 4 bit folders in FIG. 20. Each folder circuit is used to generate the LSB output code bits only when the input voltage is in its linear region. To properly determine which folder circuit to use during each input signal conversion and to determine whether the selected folder is on a positive or negatively sloped portion of its transfer function, two bits are needed from the MSB decoder. In particular, the second lowest MSB bit is used to determine which LSB folder and LSB decoder to use, and the lowest MSB bit is used to determine whether the selected folder is on a positively or negatively sloped portion of its transfer function. For instance, the first folder circuit 521 would be used for input voltages between 0.5 $V_R$ and 1.5 $V_R$, while the second folder circuit 522 would be used for input voltages between 1.5 $V_R$ and 2.5 $V_R$.

MSB DECODER THAT DECODES MSBs FROM INTERNAL VOLTAGES OF TWO FOLDER CIRCUITS

Figure 10C:
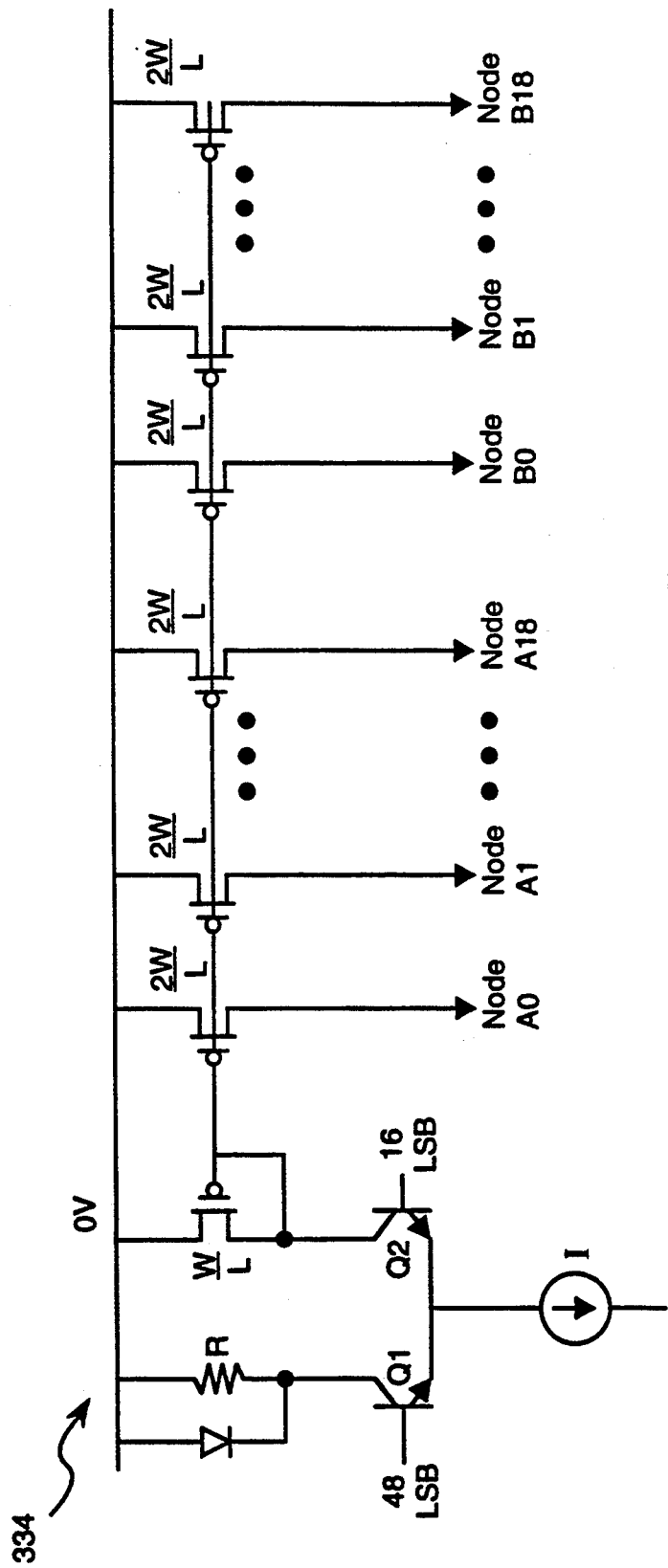
FIG. 10C is a circuit diagram of a current injection circuit for use in conjunction with the folder circuits of FIGS. 10A and 10B.

Referring to FIG. 20, the preferred embodiment of a 10-bit analog to digital converter 540 is similar to the converter 520 shown in FIG. 19, in that it incorporates parallel flash circuits and decoders. However, in this preferred embodiment, the ADC 540 has two staggered 4-bit folder circuits 322 and 324 (shown in FIGS. 10A, 10B and 10C) whose analog outputs are digitized by two parallel 4-bit LSB flash circuits 542 and 544, each of which generates a 16-level gray thermometer code. The gray code outputs from the two LSB flash circuits 542 and 544 are decoded into 4-bit values by parallel decoders 546 and 548, and one of those two 4-bit values is output as the LSBs of the converter 540 by multiplexer 550 in accordance with the second lowest bit (i.e., bit 5) output by a modified MSB decoder 552 (which generates bits 9–4).

As will be described in more detail below, the modified MSB decoder 522 generates six most significant bits (MSBs) by decoding the output voltages of the two 4-bit folder circuits 322 and 324, as well as by decoding the differential output voltages on nodes A1 to A17 in folder 322 and nodes B1 to B17 in folder 324.

The ADC 540 of FIG. 20 also incorporates the improved input sample and hold receiver 320 shown in FIGS. 9A–9C and the modified voltage reference ladder 480 of FIG. 16.

Figure 21:
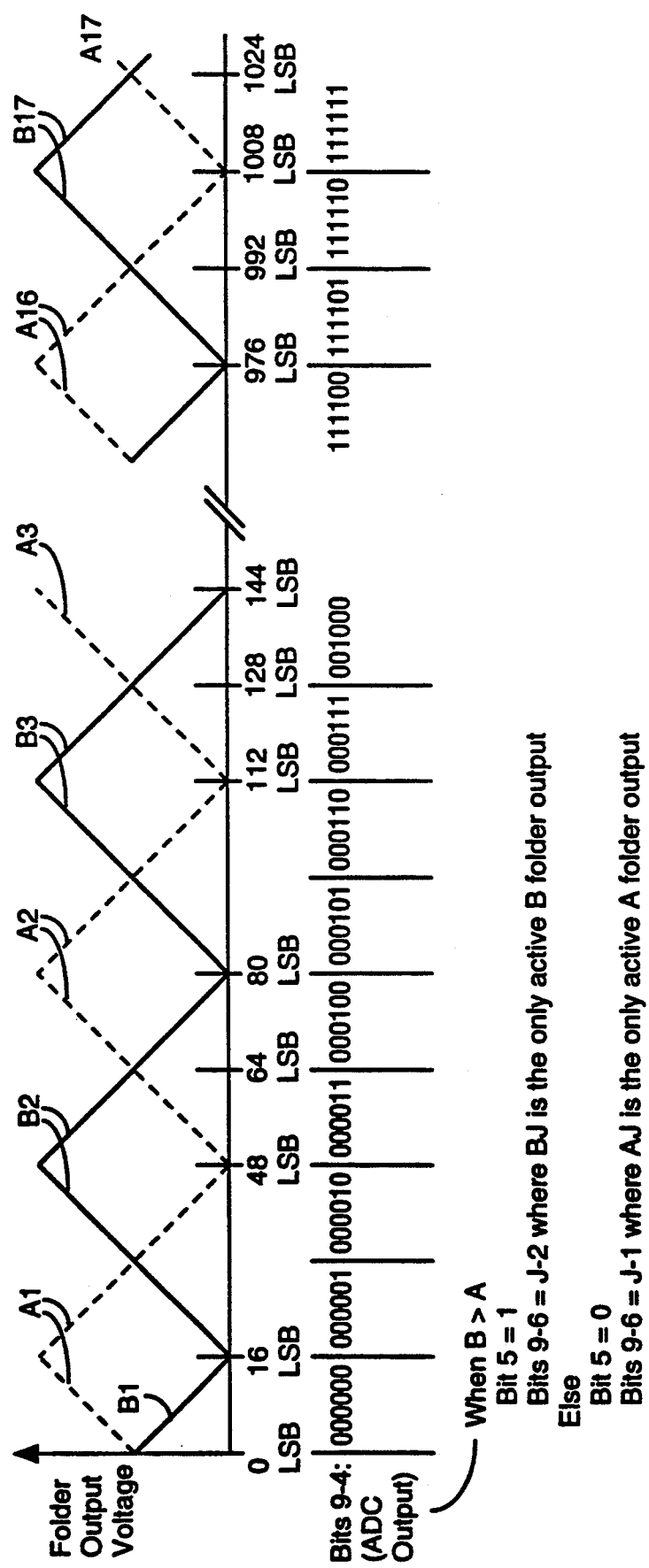
FIG. 21 shows a simplified representation of the differential output voltages from two staggered folder circuits.

For the purposes of explaining the operation of the LSB flash array circuits 522 and 524 and that of MSB decoder 552, FIG. 21 shows a simplified representation of the differential output voltages on nodes A1 to A17 in folder circuit 322 (sometimes called folder circuit A) and nodes B1 to B17 in folder circuit 324 (sometimes called folder circuit B).

It should be noted that the 10 bits output by the ADC are herein labelled bit 9 through bit 0, where bit 9 is the most significant bit and bit 0 is the least significant bit. FIG. 21 shows that the six most significant bits (bits 9 through 4) of the code generated by the ADC can be determined simply by comparing the relative voltages of various ones of the folder output voltages and differential output voltages from the two staggered folder circuits. This will be discussed in more detail, below, with respect to FIGS. 23 and 24.

The LSB flash array circuits 542 and 544 for the preferred embodiment are shown in FIG. 15A. As can be seen from the voltage transfer function shown in FIG. 21, when the output voltage of a folder circuit is on a positively sloped portion of its transfer function, the corresponding LSB decoder must generate a digital value that increases as the folder circuit output voltage increases. However, when the output voltage of a folder circuit is on a negatively sloped portion of its transfer function, the corresponding LSB decoder must generate a digital value that increases as the folder circuit output voltage decreases. More specifically, the K bits output by the LSB decoder must be inverted when the output voltage of the folder circuit is on a negatively sloped portion of its transfer function, which corresponds to the lowest MSB being equal to 0.

Figure 22:
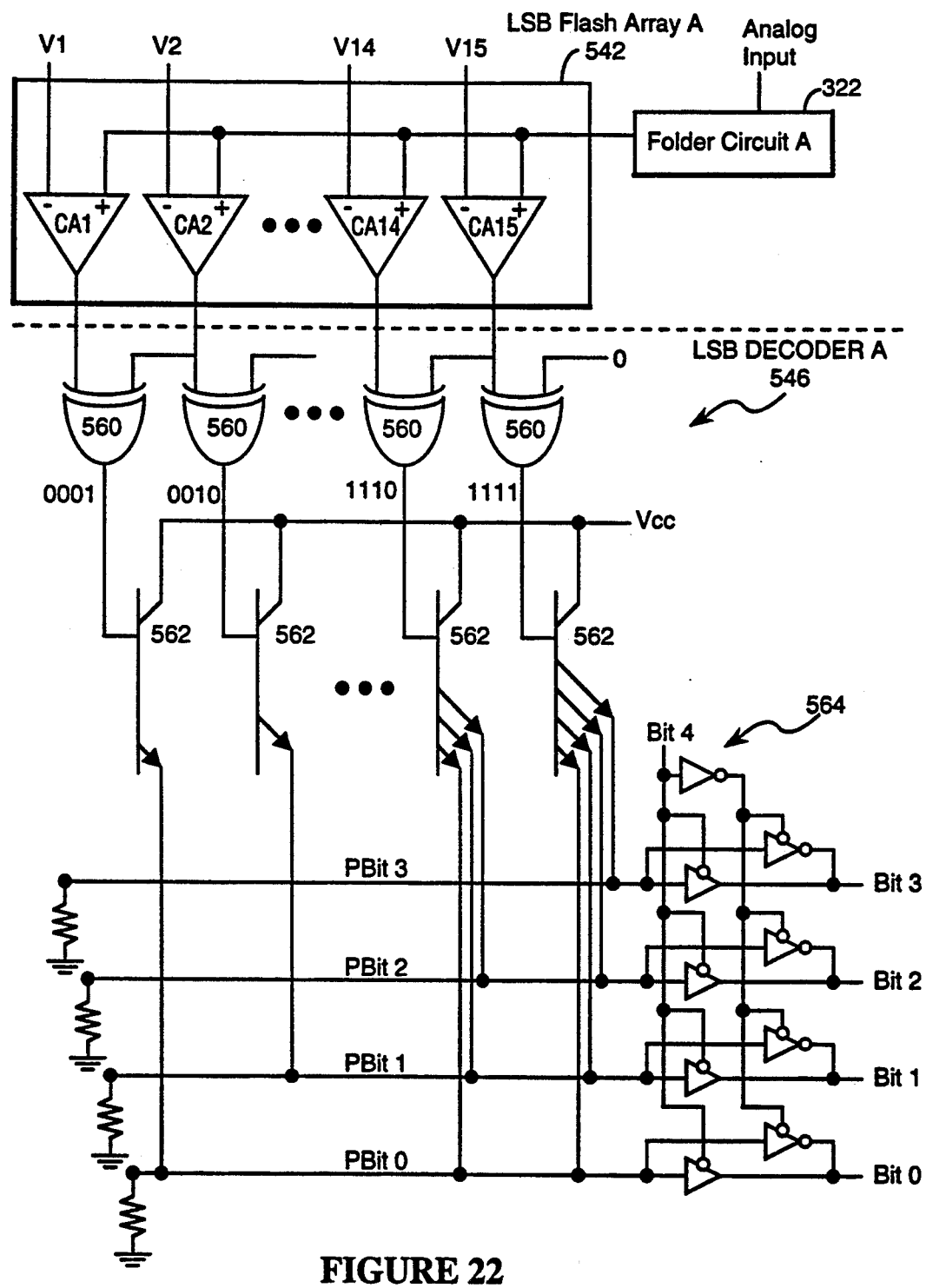
FIG. 22 is a circuit diagram of an LSB decoder.

Referring to FIG. 22, there is shown a circuit diagram of one LSB decoder 546. The fifteen binary outputs of the flash array 542 are each compared with their next highest neighbor by fifteen XOR gates 560. The XOR gates 540 will all output 0's, except for the XOR gate that is placed between the highest comparator CAi that outputs a 1 and the lowest comparator CAi+1 that outputs a 0. Only that one XOR gate 560 will output a 1. If all the flash array comparators output 0's (because the folder output voltage is less than 1 LSB), the XOR gates 560 will all output 0's, and the corresponding 4-bit LSB value is 0000. Otherwise, just one of the XOR gates 560 will output a 1. The outputs of the XOR gates are decoded using a set of fifteen parallel NPN transistors 562 in standard fashion, producing four "preliminary" bit values PBit 3 to PBit 0.

Note from the diagram in FIG. 20 that the output of decoder A 546 is selected by multiplexer 550 when bit 5 equals 0 and the output of the decoder B 548 is selected by multiplexer 550 when bit 5 equals 1. Thus, the portions of folder circuit B's output voltage when bit 5 equals 0 are irrelevant for the purposes of generating the ADC's 4 LSBs, as am the portions of folder circuit A's output voltage when bit 5 equals 1.

Referring to FIG. 22, output buffer 564 either inverts the preliminary bit values, or outputs them unchanged, based on the value of the lowest MSB (bit 4). From the voltage transfer function shown in FIG. 21 is can be seen that, ignoring folder circuit B's output when bit 5 equals 1 and ignoring folder circuit A's output when bit 5 equals 0, that the folder circuit output voltage is on a positive slope when bit 4 equals 1 and is on a negative slope when bit 4 equals 0. Thus, bit 4 determines whether or not the preliminary outputs of the decoder should be inverted or not to produce bits 3–0.

The LSB Decoder B 548 is identical to the decoder 546 shown in FIG. 22.

Figure 23:
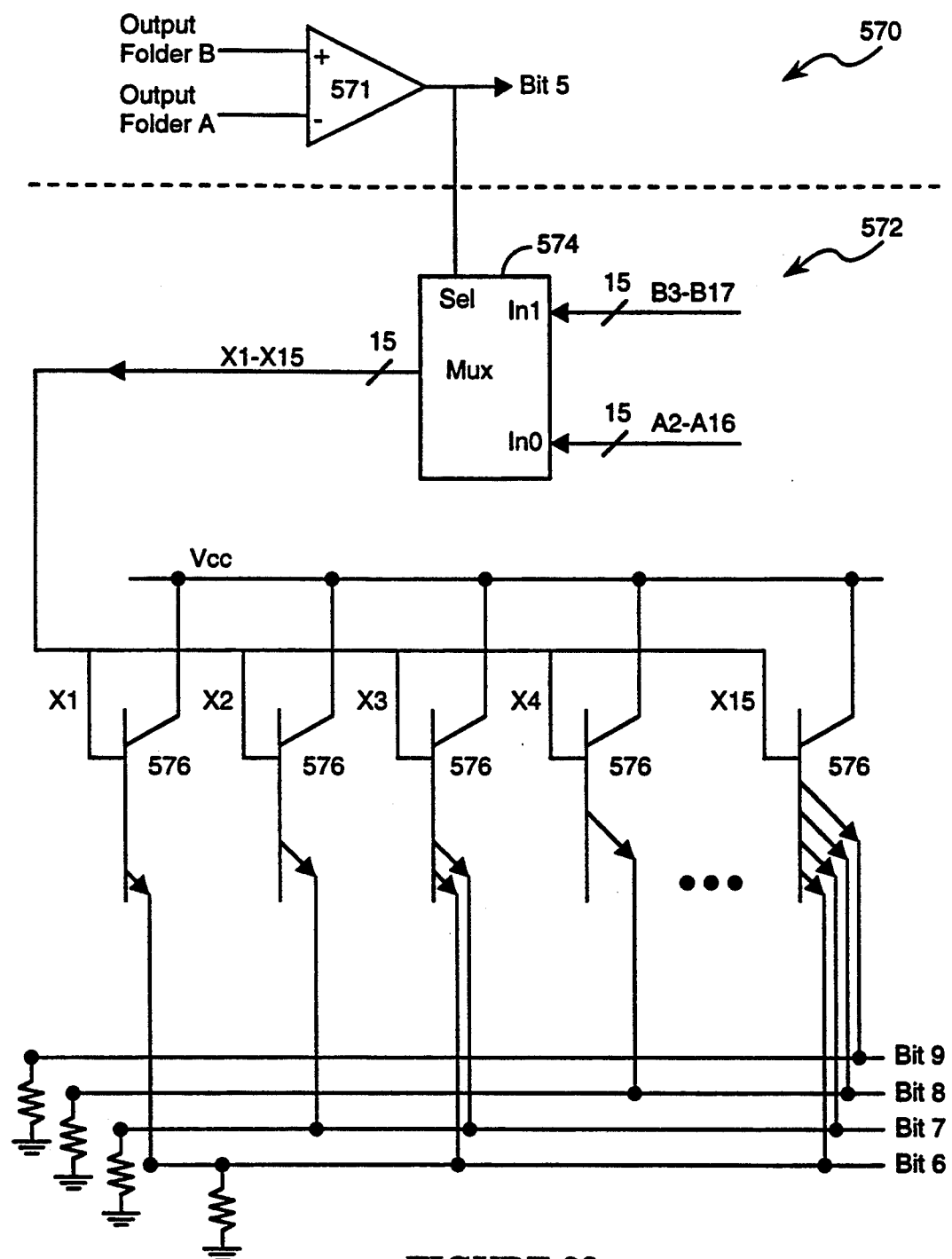
FIG. 23 is block and circuit diagram of the portions of the modified MSB decoder of the present invention that generates all but the lowest MSB of the ADC's generated output code.

Referring to FIGS. 21 and 23, the MSB decoder includes a first decoder portion 570 that generates Bit 5 simply by comparing the output voltages of the folder circuit A and folder circuit B with a comparator 571, with Bit 5 being set to a value of 1 when folder circuit B's output is greater than that of folder circuit A.

A second portion 572 of the MSB decoder generates bits 9–6. Based on the value of bit 5, a multiplexer 574 passes either the differential node voltages B2–B17 of folder circuit B or the differential node voltages A1–A16 of folder circuit A to a set of fifteen parallel NPN transistors 576. Since only one of the differential node voltages will be high, at most one of the NPN transistors will be active. The NPN transistors 576 thus act as a decoder in standard fashion, producing bits 9 to 6 of the ADC generated output code.

Figure 24:
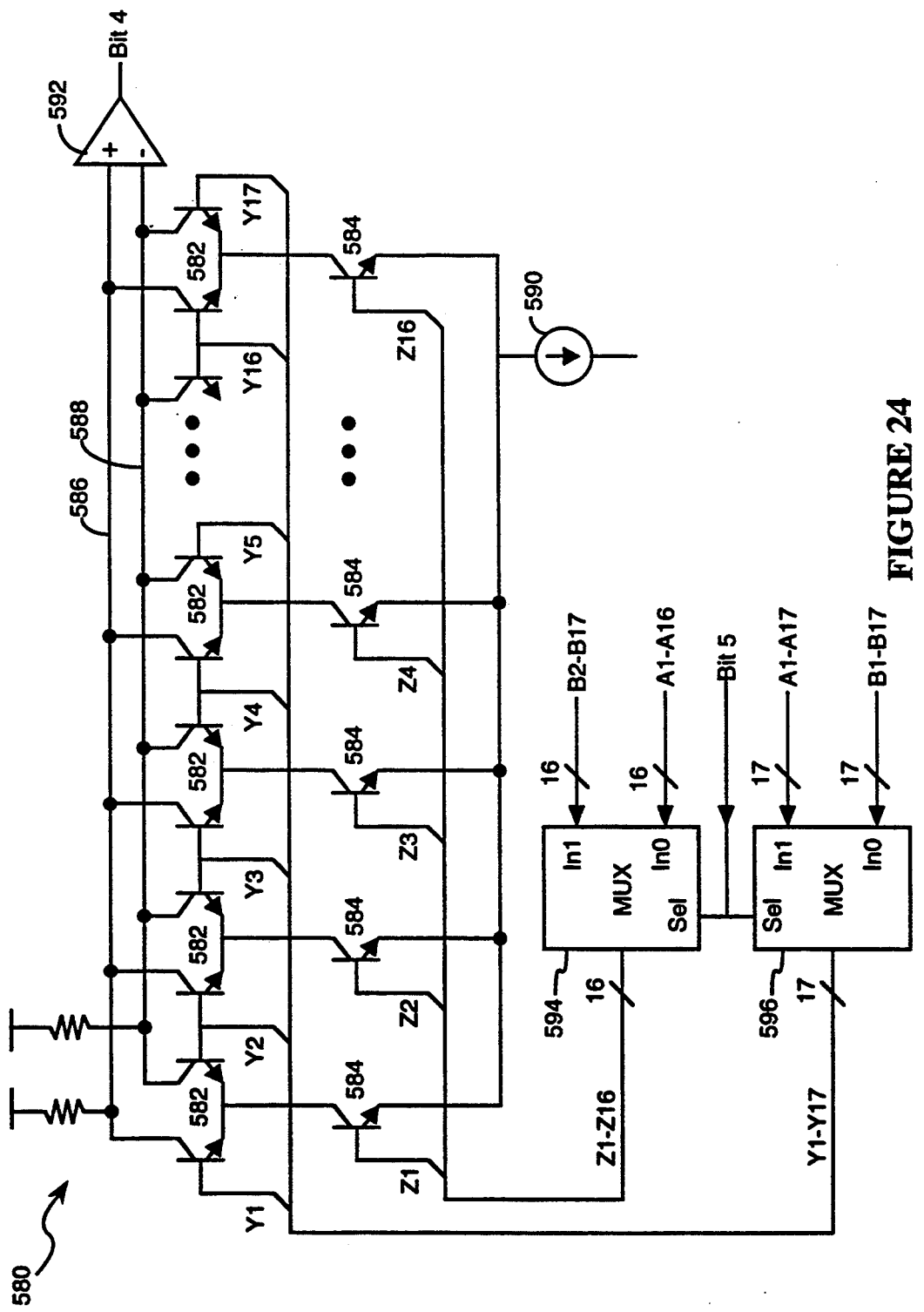
FIG. 24 is a circuit diagram of a portion the MSB decoder that generates the lowest MSB of the ADC generated output code.

Referring to FIGS. 21 and 24, a second portion 580 of the MSB decoder generates bit 4 of the ADC generated output code. The bit 4 decoder 580 generates the lowest MSB by comparing neighboring ones of the differential output voltages from a first one of the two folder circuits using sixteen differential comparator circuits 582. Each of the sixteen differential comparator circuits 582 is enabled by a pull down transistor 584 driven by a corresponding one of the differential output voltages from the other folder circuit, and thus only one of the sixteen comparator circuits 582 is enabled during the conversion of each analog input signal. The output of the enabled comparator circuit determines the value of the lowest MSB by pulling one of lines 586 and 588 low, which is accomplished by forming a current path from that line (586 or 588) to pull down current source 590. The voltages on lines 586 and 588 are compared by comparator 592 to generate bit 4.

The choice as to which folder circuit's differential output voltages are to be used by the differential comparator circuits 582 is determined by bit 5 of the ADC output code, with multiplexers 594 and 596 passing the appropriate folder circuit's differential output voltages to differential comparator circuits 582 and pull down transistors 584, respectively. From the voltage transfer function of FIG. 21 it can be seen that when bit 5 equals 1, the value of bit 4 is determined by comparing neighboring differential output voltages from folder circuit A. When bit 5 equals 0, the value of bit 4 is determined by comparing neighboring differential output voltages from folder circuit B.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A folder circuit for mapping an analog input voltage to an analog output voltage in accordance with a folding function having a first folding point, comprising:
    a power supply node;
    a first input differential stage having a first input node to which is applied said input voltage, a second input node to which is applied a first reference voltage corresponding to said first folding point, and two differential output nodes;
    a resistive network connected between said power supply node and said two differential output nodes;
    an output network for generating said analog output voltage on a common output node as a function of voltages on said two differential output nodes, said output network providing cross-coupling between said resistive network and said differential output nodes; and
    a clamping circuit coupled to said two differential output nodes for preventing saturation of said differential stage.

2. The folder circuit of claim 1 wherein said clamping circuit includes a first diode connected in parallel with said first resistor between said power supply node and one of said differential output nodes, and a second diode connected in parallel with said second resistor between said power supply node and the other of said differential output nodes.

3. The folding circuit of claim 2, wherein said input differential stage includes a first field-effect transistor connected to said first input node and a second field-effect transistor connected to said second input node.

4. A folder circuit for mapping an analog input voltage to an analog output voltage in accordance with a folding function having a first folding point, comprising:

a power supply node;

a first input differential stage having a first input node to which is applied said input voltage, a second input node to which is applied a first reference voltage corresponding to said first folding point, and two differential output nodes;

a resistive network connected between said power supply node and said two differential output nodes;

an output network for generating said analog output voltage as a function of voltages on said two differential output nodes;

a current source for drawing a predefined current from said first input differential stage; and a current injection circuit for providing an output voltage adjustment current to said input differential stage through said two differential output nodes wherein magnitude of said analog output voltage is modified in accordance with said output voltage adjustment current.

5. The folding circuit of claim 4, wherein said input differential stage includes a first field-effect transistor connected to said first input node and a second field-effect transistor connected to said second input node.

6. A folder circuit for mapping an analog input voltage to an analog output voltage in accordance with a folding function having a first folding point, comprising:

a power supply node;

a first input differential stage having a first input node to which is applied said input voltage, a second input node to which is applied a first reference voltage corresponding to said first folding point, and two differential output nodes;

a resistive network connected between said power supply node and said two differential output nodes, said resistive network including a first resistor connected between said power supply node and a first feedback node, and a second resistor connected between said feedback node and one of said differential output nodes;

an output network for generating said analog output voltage as a function of voltages on said two differential output nodes, said output network including first and second transistors for impressing said analog output voltage on a common output node; and a first feedback path between said first feedback node and said output network.

7. The folder circuit of claim 6 wherein said resistive network further includes a third resistor connected between said power supply node and a second feedback node, and a fourth resistor connected between said second feedback node and the other of said differential output nodes.

8. The folder circuit of claim 7 further including a second feedback path between said second feedback node and said output network, said second feedback path including a transistor having an output terminal connected to said second feedback node.

9. A folder circuit for mapping an analog input voltage to an analog output voltage in accordance with a folding function having a first folding point, comprising:

a power supply node;

a first input differential stage having a first input transistor to which is applied said input voltage, a second input transistor to which is applied a first reference voltage corresponding to said first folding point, and two differential output nodes;

a first resistive network connected between said power supply node and one of said two differential output nodes;

a second resistive network connected between said power supply node and the other of said two differential output nodes;

a cross-coupled output network for generating said analog output voltage on a common output node as a function of voltages on said two differential output nodes, said output network including:

a first output transistor connected between said one differential output node and said second resistive network, and a second output transistor connected between said other differential output node and said first resistive network;

a clamping circuit for preventing saturation of said input transistors, said clamping circuit including a first diode connected in parallel with said first resistive network and a second diode connected in parallel with said second resistive network.

10. A folder circuit for mapping an analog input voltage to an analog output voltage in accordance with a folding function having a first folding point, comprising:

a power supply node;

a first input differential stage having a first input transistor to which is applied said input voltage, a second input node having a second input transistor to which is applied a first reference voltage corresponding to said first folding point, and two differential output nodes;

a first resistive network connected between said power supply node and one of said two differential output nodes;

a second resistive network connected between said power supply node and the other of said two differential output nodes;

an output network for generating said analog output voltage as a function of voltages on said two differential output nodes, said output network including:

a first output transistor connected between said one differential output node and said second resistive network, and a second output transistor connected between said other differential output node and said first resistive network;

a current source for drawing a predefined current from said first input differential stage; and a current injection circuit for providing an output voltage adjustment current to said input differential stage through said two differential output nodes wherein magnitude of said analog output voltage is modified in accordance with said output voltage adjustment current.

11. A folder circuit for mapping an analog input voltage to an analog output voltage in accordance with a folding function having a first folding point, comprising:

a power supply node;

a first input differential stage having a first input transistor to which is applied said input voltage, a second input node having a second input transistor to which is applied a first reference voltage corresponding to said first folding point, and two differential output nodes;

a resistive network connected between said power supply node and said two differential output nodes, said resistive network including:
  a first resistor connected between said power supply node and a first feedback node, a second resistor connected between said feedback node and one of said differential output nodes, a third resistor connected between said power supply node and a second feedback node, and a fourth resistor connected between said second feedback node and the other of said differential output nodes; and
  an output network for qenerating said analog output voltage as a function of voltages on said two differential output nodes, said output network including first and second transistors for impressing said analog output voltage on a common output node.

12. The folder circuit of claim 11 further including:
  a first feedback path between said first feedback node and said output network; and
  a second feedback path between said second feedback node and said output network.

13. A folder circuit for mapping an analog input voltage to an analog output voltage in accordance with a folding function having at least first and second folding points, comprising:
  a power supply node;
  a first input differential stage having a first input node to which is applied said input voltage, a second input node to which is applied a first reference voltage corresponding to said first folding point, and a first set of two differential output nodes;
  a resistive network connected between said power supply node and said first set of two differential output nodes, said resistive network including a first resistor connected between said power supply node and a first feedback node, and a second resistor connected between said feedback node and a first differential output node of said first set of differential output nodes;
  a second input differential stage having a third input node to which is applied said input voltage, a fourth input node to which is applied a second reference voltage corresponding to said second folding point, and a second set of two differential output nodes;
  an output network for generating said analog output voltage as a function of voltages on said first and second sets of differential output nodes, said output network including at least first and second transistors for impressing said analog output voltage on a common output node; and
  a first feedback path between said first feedback node and said output network.

* * * * *